(12) United States Patent
Yamazaki et al.

(10) Patent No.: US 8,975,930 B2
(45) Date of Patent: Mar. 10, 2015

(54) SEMICONDUCTOR DEVICE AND METHOD FOR DRIVING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/961,066

(22) Filed: Aug. 7, 2013

(65) Prior Publication Data

US 2014/0043093 A1 Feb. 13, 2014

(30) Foreign Application Priority Data

Aug. 10, 2012 (JP) ................. 2012-177863

(51) Int. Cl.
*H03B 1/00* (2006.01)
*H01L 27/06* (2006.01)
(Continued)

(52) U.S. Cl.
CPC ............ *H03K 3/012* (2013.01); *H01L 27/0629* (2013.01); *H01L 27/1225* (2013.01); *H01L 27/092* (2013.01); *H03K 19/0013* (2013.01); *H01L 27/0688* (2013.01); *H01L 29/78648* (2013.01)
USPC ............................ 327/108; 327/112; 327/427

(58) Field of Classification Search
USPC ................. 327/108–112, 170, 389, 391, 427; 326/26, 27, 82, 83
See application file for complete search history.

(56) References Cited

U.S. PATENT DOCUMENTS

| 5,274,601 A | 12/1993 | Kawahara et al. |
| 5,731,856 A | 3/1998 | Kim et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Long Nguyen
(74) *Attorney, Agent, or Firm* — Fish & Richardson P.C.

(57) ABSTRACT

Direct-path current is reduced in a semiconductor device including CMOS circuits. One embodiment of the present invention is a method for driving a semiconductor device that includes a first CMOS circuit between power supply lines, a first transistor between the power supply lines, a second CMOS circuit between the power supply lines, and a second transistor between an output terminal of the first CMOS circuit and an input terminal of the second CMOS circuit. The first transistor and the second transistor each have lower off-state current than a transistor included in the first CMOS circuit. In a period during which the voltage of a first signal input to the first CMOS circuit is changed, a second signal is input to the first transistor and the second transistor to turn off the first transistor and the second transistor.

20 Claims, 13 Drawing Sheets

(51) Int. Cl.
*H03K 3/012* (2006.01)
*H01L 27/12* (2006.01)
*H03K 19/00* (2006.01)
*H01L 27/092* (2006.01)
*H01L 29/786* (2006.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,207,756 B2 | 6/2012 | Shionoiri et al. | |
| 8,400,187 B2 * | 3/2013 | Yamazaki et al. | 326/83 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101333 A1 | 5/2011 | Shionoiri et al. | |
| 2011/0140099 A1 | 6/2011 | Yamazaki | |
| 2011/0278564 A1 | 11/2011 | Yoneda | |
| 2012/0292616 A1 | 11/2012 | Ohshima | |
| 2012/0299626 A1 * | 11/2012 | Fujita et al. | 327/115 |
| 2014/0043068 A1 | 2/2014 | Yamazaki et al. | |
| 2014/0043094 A1 | 2/2014 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-210976 A | 8/1993 |
| JP | 05-251705 A | 9/1993 |
| JP | 07-202677 A | 8/1995 |
| JP | 08-264794 A | 10/1996 |
| JP | 11-505377 A | 5/1999 |
| JP | 11-177408 A | 7/1999 |
| JP | 2000-044236 A | 2/2000 |
| JP | 2000-150900 A | 5/2000 |
| JP | 2001-044822 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Orita, M et al., "Amorphous transparent conductive oxide InGaO3(ZnO)m (m<4): a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel Using Amorphous In-Ga-Zn-Oxide TFT," SID Digest '09 : SID International Symposium Digest of Technical Papers, May 31, 2009, pp. 184-187.

(56) References Cited

OTHER PUBLICATIONS

Osada, T et al., "Development of Driver-Integrated Panel Using Amorphous In-Ga-Zn-Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium-Gallium-Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by PEALD Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMCLDS ," Journal of the SID, 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using Cg-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.

(56) References Cited

OTHER PUBLICATIONS

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structires," NIRIM Newsletter, Mar. 1995, vol. 150, pp. 1-4 with English Translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

* cited by examiner

FIG. 12A
FIG. 12D
FIG. 12B
FIG. 12E
FIG. 12C
FIG. 12F
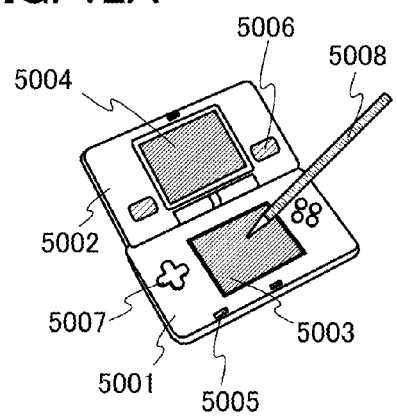
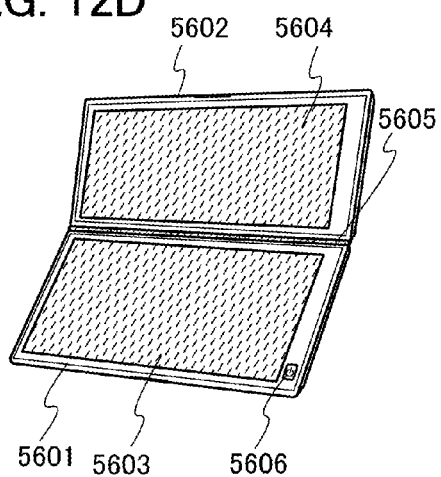
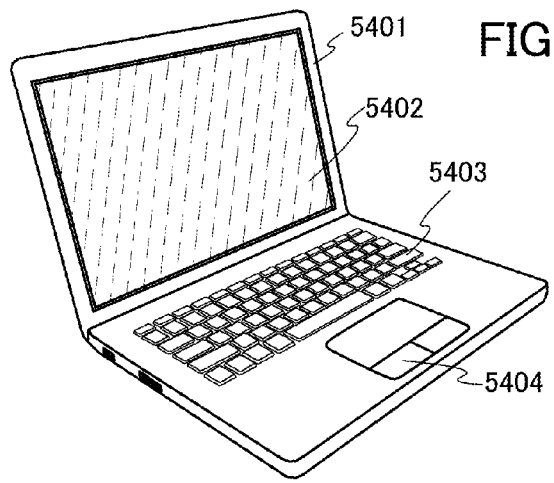
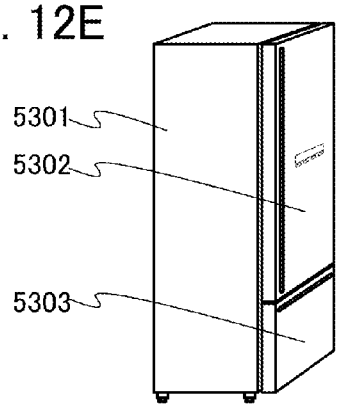
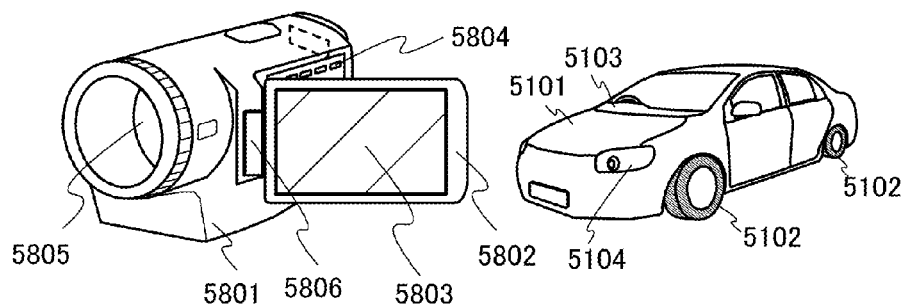

SEMICONDUCTOR DEVICE AND METHOD FOR DRIVING SEMICONDUCTOR DEVICE

BACKGROUND OF THE INVENTION

1. Field of the Invention

The present invention relates to semiconductor devices and methods for driving the semiconductor devices.

Note that in this specification, a semiconductor device means a device including a semiconductor element or a circuit including a semiconductor element.

2. Description of the Related Art

Techniques for reducing the power consumption of semiconductor devices have been developed. In order to reduce power consumption, transistors each including a channel formation region in a silicon layer are used for a complementary metal oxide semiconductor (CMOS) circuit.

In a CMOS circuit, direct-path current between power supply lines is reduced by turning on one of an n-channel transistor and a p-channel transistor provided between the power supply lines and turning off the other of the n-channel transistor and the p-channel transistor. However, when gates of the n-channel transistor and the p-channel transistor are increased in size and the amplitude of voltage is changed slowly, the n-channel transistor and the p-channel transistor are concurrently turned on in a period during which voltage applied to the gates of the n-channel transistor and the p-channel transistor is changed. Thus, the CMOS circuit has a problem of insufficient reduction in direct-path current (for example, Patent Document 1).

REFERENCE

Patent Document 1: Japanese Published Patent Application No. 11-177408

SUMMARY OF THE INVENTION

Patent Document 1 discloses a structure in which direct-path current is reduced by connecting a transistor for preventing direct-path current in series with an inverter circuit and by controlling the transistor. However, the transistor for preventing direct-path current includes a channel formation region in a silicon layer, like a transistor included in the inverter circuit. Thus, current (off-state current) flows even when the transistor for preventing direct-path current is turned off, and direct-path current flowing between power supply lines cannot be reduced.

It is an object of one embodiment of the present invention to reduce direct-path current in a semiconductor device including CMOS circuits.

One embodiment of the present invention is a method for driving a semiconductor device that includes a first CMOS circuit between power supply lines, a first transistor between the power supply lines, a second CMOS circuit between the power supply lines, and a second transistor between an output terminal of the first CMOS circuit and an input terminal of the second CMOS circuit. The first transistor and the second transistor each have lower off-state current than a transistor included in the first CMOS circuit. In a period during which the voltage of a first signal input to the first CMOS circuit is changed, a second signal is input to the first transistor and the second transistor to turn off the first transistor and the second transistor.

One embodiment of the present invention is a method for driving a semiconductor device that includes a first CMOS circuit provided between power supply lines, a first transistor whose off-state current is lower than that of a transistor included in the first CMOS circuit and which is provided between the power supply lines, a second CMOS circuit provided between the power supply lines, a second transistor whose off-state current is lower than that of the transistor included in the first CMOS circuit and which is provided between an output terminal of the first CMOS circuit and an input terminal of the second CMOS circuit. In a period during which the voltage of a first signal input to the first CMOS circuit is changed and in a period during which the transistor included in the first CMOS circuit and electrically connected to the first transistor is off, a second signal is input to the first transistor and the second transistor to turn off the first transistor and the second transistor.

In the method for driving a semiconductor device according to one embodiment of the present invention, the transistors included in the first CMOS circuit and the second CMOS circuit preferably each include a channel formation region in a silicon layer.

In the method for driving a semiconductor device according to one embodiment of the present invention, the first transistor and the second transistor preferably each include a channel formation region in an oxide semiconductor layer.

According to one embodiment of the present invention, it is possible to reduce direct-path current in a semiconductor device including CMOS circuits. According to one embodiment of the present invention, the off-state of a transistor having low off-state current enables the voltage of a signal input to an input terminal of the CMOS circuit to be held and enables the charging and discharging number of electric charge to be reduced. Thus, the power consumption of the semiconductor device can be reduced.

BRIEF DESCRIPTION OF THE DRAWINGS

In the accompanying drawings:

FIGS. 12A to 12F illustrate examples of electronic devices; and

DETAILED DESCRIPTION OF THE INVENTION

Examples of embodiments of the present invention will be described. Note that it will be readily appreciated by those skilled in the art that details of the embodiments can be modified without departing from the spirit and scope of the present invention. The present invention is therefore not limited to the following description of the embodiments, for example.

Note that the size, the layer thickness, the signal waveform, or the region of each component illustrated in drawings and the like in embodiments is exaggerated for clarity in some cases. Thus, embodiments of the present invention are not limited to such scales.

Further, ordinal numbers such as "first" and "second" are used to avoid confusion among components and do not limit the number of each component.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification, the trigonal and rhombohedral crystal systems are included in the hexagonal crystal system.

Embodiment 1

In this embodiment, an example of a method for driving a semiconductor device according to one embodiment of the present invention is described.

Figure 1A:
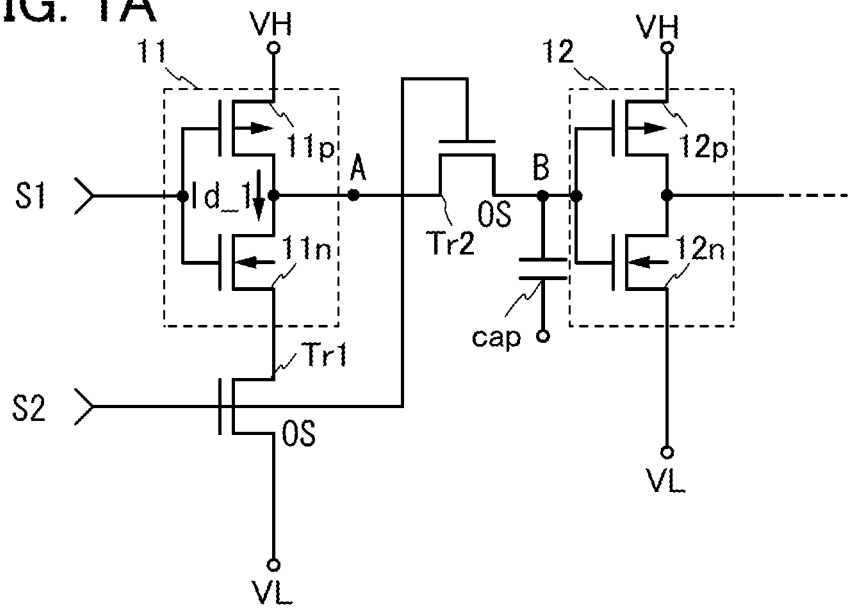
FIGS. 1A and 1B are a circuit diagram and a timing chart for describing one embodiment of the present invention.

FIG. 1A is a circuit diagram illustrating an example of a semiconductor device in this embodiment.

The semiconductor device in FIG. 1A includes a first CMOS circuit 11, a first transistor Tr1, a second transistor Tr2, a capacitor cap, and a second CMOS circuit 12.

The first CMOS circuit 11 is a circuit constituted of a combination of a p-channel transistor 11p and an n-channel transistor 11n. A first signal S1 is input to the first CMOS circuit 11 through an input terminal. In the first CMOS circuit 11, the voltage of an output terminal is changed in response to the first signal S1 input, and the changed voltage is output as a signal.

Gates of the p-channel transistor 11p and the n-channel transistor 11n correspond to the input terminal of the first CMOS circuit 11. A node between the p-channel transistor 11p and the n-channel transistor 11n corresponds to the output terminal of the first CMOS circuit 11.

First voltage VH that is a high power supply potential for supplying power supply voltage to the first CMOS circuit 11 is applied to the first CMOS circuit 11. In addition, second voltage VL that is a low power supply potential for supplying power supply voltage to the first CMOS circuit 11 is applied to the first CMOS circuit 11 through the first transistor Tr1.

Note that a wiring to which the first voltage VH is applied is referred to as a first power supply line, and a wiring to which the second voltage VL is applied is referred to as a second power supply line. The first CMOS circuit 11 and the first transistor Tr1 are provided between the first power supply line and the second power supply line. When the first CMOS circuit 11 and the first transistor Tr1 are turned on or off, direct-path current flows between the power supply lines. The first CMOS circuit 11 and the first transistor Tr1 are connected to the first power supply line and the second power supply line.

Note that the first CMOS circuit 11 can be a circuit that functions as a NOT circuit (an inverter circuit), an OR circuit, an AND circuit, a NOR circuit, or a NAND circuit with a combination of one or more of the p-channel transistors 11p and one or more of the n-channel transistors 11n. FIG. 1A illustrates an inverter circuit including one p-channel transistor 11p and one n-channel transistor 11n as the first CMOS circuit 11. Each of the p-channel transistor 11p and the n-channel transistor 11n can be, for example, a transistor including a channel formation region in a silicon layer.

The first signal S1 is an input signal for operating the first CMOS circuit 11 as a logic circuit. Note that the plurality of first signals S1 are input to the first CMOS circuit 11 depending on the circuit structure of the first CMOS circuit 11. In the case where the first CMOS circuit 11 is an inverter circuit as illustrated in FIG. 1A, one first signal S1 is input to the first CMOS circuit 11. In the case where the first CMOS circuit 11 is a NAND circuit, for example, two or more first signals S1 are input to the first CMOS circuit 11 through the input terminal.

The second voltage VL is applied to the gates of the p-channel transistor 11p and the n-channel transistor 11n as the first signal S1 to turn on the p-channel transistor 11p and turn off the n-channel transistor 11n. The first voltage VH is applied to the gates of the p-channel transistor 11p and the n-channel transistor 11n as the first signal S1 to turn off the p-channel transistor 11p and turn on the n-channel transistor 11n.

When the gates of the p-channel transistor 11p and the n-channel transistor 11n in the first CMOS circuit 11 are increased in size, the amplitude of the voltage of the first signal S1 is changed slowly. Thus, the first signal S1 turns on the n-channel transistor and the p-channel transistor concurrently in a period during which voltage applied to the gates of the n-channel transistor and the p-channel transistor is changed. Consequently, direct-path current is generated in the first CMOS circuit 11.

The first transistor Tr1 has lower off-state current than the p-channel transistor 11p and the n-channel transistor 11n included in the first CMOS circuit 11. A transistor including a channel formation region in an oxide semiconductor can be used as a transistor having lower off-state current than the p-channel transistor 11p and the n-channel transistor 11n each including a channel formation region in a silicon layer. Note that the first transistor Tr1 may be an n-channel transistor or a p-channel transistor. In this embodiment, the first transistor Tr1 is an n-channel transistor.

Note that in drawings, symbols "OS" are provided to transistors having low off-state current, such as the first transistor Tr1, in order to distinguish such transistors from a transistor including a channel formation region in a silicon layer. In the case where the first transistor Tr1 has lower off-state current than the p-channel transistor 11p and the n-channel transistor 11n each including the channel formation region in the silicon layer, direct-path current can be greatly reduced when the first transistor Tr1 is turned off.

A metal oxide-based material can be used for the oxide semiconductor. Examples of the oxide semiconductor are a metal oxide containing zinc and one or both of indium and gallium, and the metal oxide in which gallium is partly or entirely replaced with another metal element.

The carrier density of the oxide semiconductor included in a channel is lower than $1\times10^{14}$ atoms/cm$^3$, preferably lower than $1\times10^{12}$ atoms/cm$^3$, more preferably lower than $1\times10^{11}$ atoms/cm$^3$. In order to achieve such carrier density, the concentration of donor impurities contained in the oxide semiconductor is reduced. For example, the amount of hydrogen regarded as a donor impurity is preferably reduced to lower than or equal to $1\times10^{19}$ atoms/cm$^3$, more preferably lower than or equal to $1\times10^{18}$ atoms/cm$^3$.

With the carrier density, off-state current per micrometer of channel length and per micrometer of channel width of a field-effect transistor can be reduced to lower than or equal to $1\times10^{-19}$ A (100 zA), preferably lower than or equal to $1\times10^{-20}$ A (10 zA), more preferably lower than or equal to $1\times10^{-21}$ A (1 zA), and even more preferably lower than or equal to $1\times10^{-22}$ A (100 yA).

The off-state current of a transistor including a channel formation region formed using an oxide semiconductor containing indium, zinc, and gallium is described with reference to FIG. 13.

Since the off-state current of the transistor is extremely low, in order to measure the off-state current, it is necessary to form a transistor with a comparatively large size and estimate actually flowing off-state current.

Figure 13:
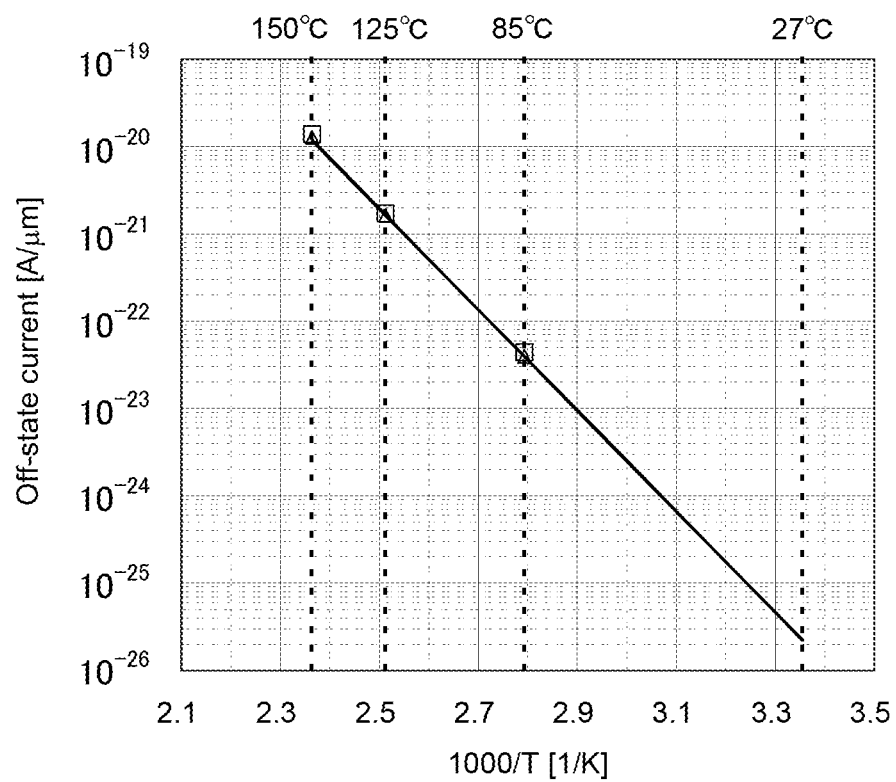
FIG. 13 is an Arrhenius plot showing off-state current of a transistor.

For example, FIG. 13 shows an Arrhenius plot of off-state current estimated from off-state current per micrometer of channel width W of a transistor having a channel width W of 1 m (1000000 μm) and a channel length L of 3 μm when temperature changes to 150° C., 125° C., 85° C., and 27° C.

In FIG. 13, for example, the off-state current of the transistor at 27° C. is lower than or equal to $1\times10^{-25}$ A. FIG. 13 shows that the transistor including a channel formation region formed using an oxide semiconductor containing indium, zinc, and gallium has extremely low off-state current.

The use of the transistor having low off-state current as the first transistor Tr1 enables a significant reduction in direct-path current when the first transistor Tr1 is turned off.

Note that the first transistor Tr1 may be stacked over the transistors (e.g., the p-channel transistor 11p and the n-channel transistor 11n) included in the first CMOS circuit 11. Such a structure can reduce the circuit area of the semiconductor device.

A second signal S2 is input to a gate of the first transistor Tr1. Conduction or non-conduction between one of a source and a drain of the first transistor Tr1 and the other of the source and the drain of the first transistor Tr1 is controlled in response to the second signal S2 input to the gate of the first transistor Tr1.

The second transistor Tr2 has lower off-state current than the p-channel transistor 11p and the n-channel transistor 11n included in the first CMOS circuit 11 like the first transistor Tr1. A transistor including a channel formation region in an oxide semiconductor can be used as the second transistor Tr2 like the first transistor Tr1.

The use of a transistor having low off-state current as the second transistor Tr2 enables electric charge in a floating node to be held when the second transistor Tr2 is turned off.

The second signal S2 is input to a gate of the second transistor Tr2. Conduction or non-conduction between one of a source and a drain of the second transistor Tr2 and the other of the source and the drain of the second transistor Tr2 is controlled in response to the second signal S2 input to the gate of the second transistor Tr2. One of the source and the drain of the second transistor Tr2 is connected to the output terminal of the first CMOS circuit 11. The other of the source and the drain of the second transistor Tr2 is connected to an input terminal of the second CMOS circuit 12.

The second signal S2 is a signal for controlling the on-state and off-state of the first transistor Tr1 and the second transistor Tr2. Note that different signals may be input to the first transistor Tr1 and the second transistor Tr2 as the second signal S2. In the case where the first transistor Tr1 and the second transistor Tr2 are n-channel transistors as described above, the first transistor Tr1 and the second transistor Tr2 are turned on when the second signal S2 has the first voltage VH, and the first transistor Tr1 and the second transistor Tr2 are turned off when the second signal S2 has the second voltage VL.

A change in amplitude of the voltage of the second signal S2 is preferably more rapid than or as rapid as a change in amplitude of the voltage of the first signal S1. For example, the second signal S2 may be input to the gate of the first transistor Tr1 and the gate of the second transistor Tr2 through a buffer circuit or the like. In addition, in the case where the first transistor Tr1 and the second transistor Tr2 function as switches, the second signal S2 preferably has voltage that is higher than the first voltage VH to turn on the transistors.

Note that the second transistor Tr2 may be stacked over the transistors (e.g., the p-channel transistor 11p and the n-channel transistor 11n) included in the first CMOS circuit 11. Such a structure can reduce the circuit area of the semiconductor device.

The capacitor cap holds electric charge in a node between the second transistor Tr2 and the second CMOS circuit 12. Electric charge held in the capacitor is based on a signal input to the input terminal of the second CMOS circuit 12. As described above, when the second transistor Tr2 is turned off, electric charge held in the capacitor cap hardly leaks.

The second CMOS circuit 12 is a circuit constituted of a combination of a p-channel transistor 12p and an n-channel transistor 12n. A signal based on voltage that is applied to the other of the source and the drain of the second transistor Tr2 and is changed is input to the second CMOS circuit 12 through the input terminal. In the second CMOS circuit 12, the voltage of an output terminal is changed in response to the signal input, and the changed voltage is output as a signal.

Gates of the p-channel transistor 12p and the n-channel transistor 12n correspond to the input terminal of the second CMOS circuit 12. A node between the p-channel transistor 12p and the n-channel transistor 12n corresponds to the output terminal of the second CMOS circuit 12.

The first voltage VH that is a high power supply potential for supplying power supply voltage to the second CMOS circuit 12 is applied to the second CMOS circuit 12. In addition, the second voltage VL that is a low power supply potential for supplying power supply voltage to the second CMOS circuit 12 is applied to the second CMOS circuit 12.

Note that the second CMOS circuit 12 can be a circuit that functions as a NOT circuit (an inverter circuit), an OR circuit, an AND circuit, a NOR circuit, or a NAND circuit with a combination of one or more of the p-channel transistors 12p and one or more of the n-channel transistors 12n, like the first CMOS circuit 11. FIG. 1A illustrates an inverter circuit including one p-channel transistor 12p and one n-channel transistor 12n as the second CMOS circuit 12. Each of the p-channel transistor 12p and the n-channel transistor 12n can be, for example, a transistor including a channel formation region in a silicon layer, like each of the p-channel transistor 11p and the n-channel transistor 11n.

Next, a method for driving the semiconductor device in FIG. 1A is described. For illustrative purposes, in the circuit diagram of the semiconductor device in FIG. 1A, a node to which the output terminal of the first CMOS circuit 11 is connected is denoted by "A", and a change in voltage at the node A is described as the signal of the node A. Further, a node to which the input terminal of the second CMOS circuit 12 is connected is denoted by "B", and a change in voltage at the node B is described as the signal of the node B. Drain current flowing to the first CMOS circuit 11 is denoted by "Id_1".

Figure 1B:
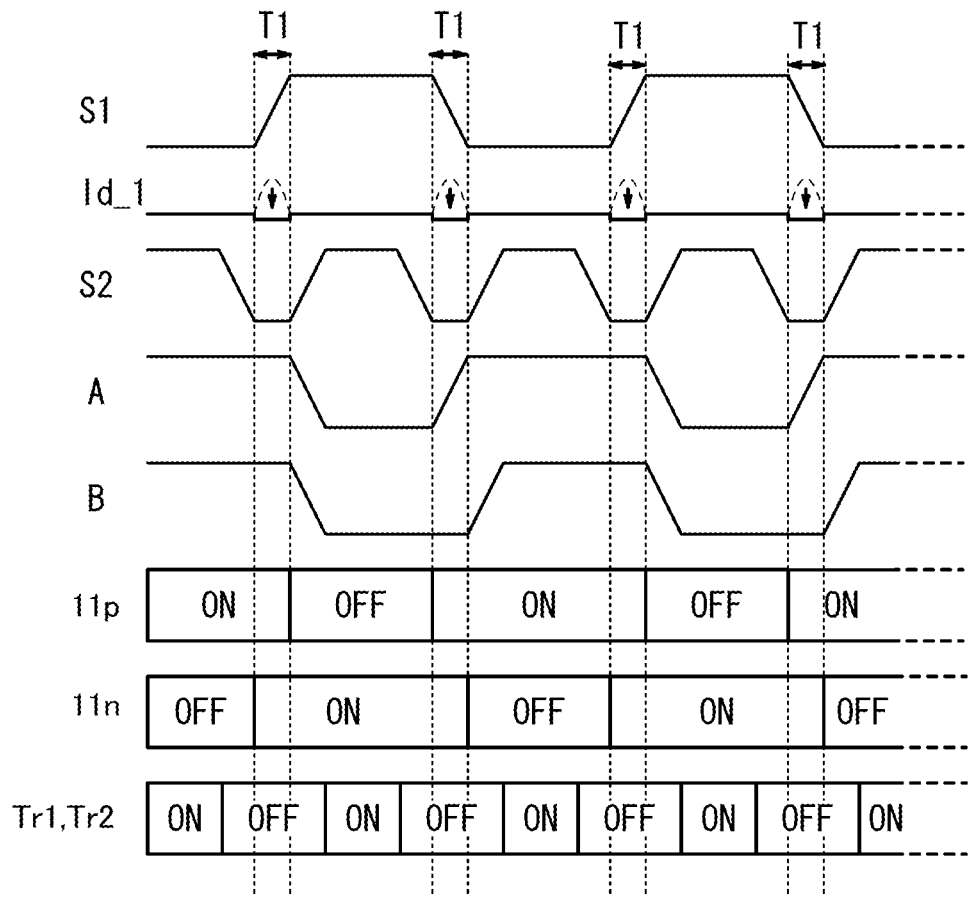

A timing chart in FIG. 1B shows the first signal S1, the drain current Id_1, the second signal S2, the signal of the node A, the signal of the node B, the on-state (denoted by "ON") and off-state (denoted by "OFF") of the p-channel transistor 11p, the on-state and off-state of the n-channel transistor 11n, and the on-state and off-state of the first transistor Tr1 in FIG. 1A.

Here, the characteristics of the transistors are described in order to describe the on-state and off-state of the p-channel transistor 11p, the on-state and off-state of the n-channel transistor 11n, and the on-state and off-state of the first transistor Tr1 that is an n-channel transistor in the timing chart in FIG. 1B.

Figure 2A:
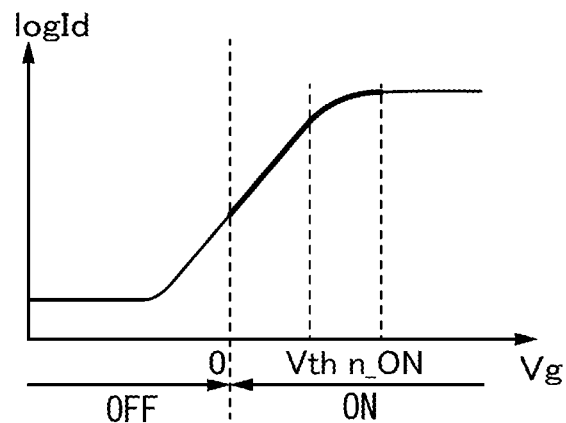
FIGS. 2A and 2B show characteristics of transistors.
Figure 2B:
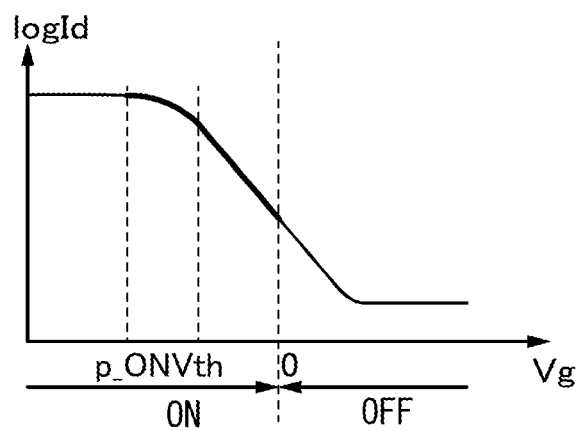

FIG. 2A is a schematic graph showing the characteristics of an n-channel transistor. In FIG. 2A, the horizontal axis represents gate voltage Vg, and the vertical axis represents the logarithm of drain current logId. FIG. 2B is a schematic graph showing the characteristics of a p-channel transistor. In FIG. 2B, the horizontal axis represents gate voltage Vg, and the vertical axis represents the logarithm of drain current logId. Note that the graphs in FIGS. 2A and 2B each show the characteristics of one transistor, assuming that the source voltage of the n-channel transistor and the p-channel transistor is 0 V.

The n-channel transistor is turned on at voltage n_ON (0 V<n_ON) and is turned off at 0 V. However, as shown in FIG. 2A, the graph showing the characteristics of the n-channel transistor has an area where a slight amount of current flows in a weak inversion region in which the voltage Vg is higher than 0 V and lower than or equal to the threshold voltage Vth and a strong inversion region in which the voltage Vg is higher than the threshold voltage Vth and lower than the voltage n_ON (a curve indicated by a thick line in the graph in FIG. 2A). Similarly, the p-channel transistor is turned on at voltage p_ON (0 V>p_ON) and is turned off at 0 V. However, as shown in FIG. 2B, the graph showing the characteristics of the p-channel transistor has an area where a slight amount of current flows in a weak inversion region in which the voltage Vg is higher than the voltage p_ON and lower than or equal to the threshold voltage Vth and a strong inversion region in which the voltage Vg is higher than the threshold voltage Vth and lower than 0 V (a curve indicated by a thick line in the graph in FIG. 2B).

In light of the above description, in this embodiment, a state where the voltage Vg is higher than 0 V, that is, gate-source voltage Vgs is higher than 0 V as shown in FIG. 2A is described as the on-state of the n-channel transistor. In contrast, a state where the voltage Vg is lower than or equal to 0 V, that is, the gate-source voltage Vgs is lower than or equal to 0 V as shown in FIG. 2A is described as the off-state of the n-channel transistor.

Further, in this embodiment, as shown in FIG. 2B, a state where the voltage Vg is lower than 0 V, that is, gate-source voltage Vgs is lower than 0 V as shown in FIG. 2B is described as the on-state of the p-channel transistor. In contrast, a state where the voltage Vg is higher than or equal to 0 V, that is, the gate-source voltage Vgs is higher than or equal to 0 V as shown in FIG. 2B is described as the off-state of the p-channel transistor.

In light of the description of the on-state and off-state of the p-channel transistor and the n-channel transistor with reference to FIGS. 2A and 2B, in the first CMOS circuit 11 in FIG. 1A, in a period during which the amplitude of voltage is changed slowly, that is, a period during which voltage applied to the gates of the n-channel transistor and the p-channel transistor is changed by the first signal S1, the n-channel transistor and the p-channel transistor are concurrently turned on. Thus, direct-path current is generated.

The above is the description of the characteristics of the transistors.

FIG. 1B is described again. The timing chart in FIG. 1B shows a period (period T1) during which the voltage of the first signal S1 is changed slowly. The timing chart in FIG. 1B also shows an increase in the drain current Id_1 in the period during which the voltage is changed (a region of a signal representing the drain current Id_1 that is indicated by a dotted line).

In the method for driving a semiconductor device in this embodiment, in the period T1 in which the drain current Id_1 is increased, the second signal S2 is made to have the second voltage VL so that the first transistor Tr1 and the second transistor Tr2 are turned off; thus, direct-path current generated at the time when the p-channel transistor 11p and the n-channel transistor 11n in the first CMOS circuit 11 are turned on is reduced.

Note that timing of making the second signal S2 have the second voltage VL to turn off the first transistor Tr1 and the second transistor Tr2 may be determined in the following manner. The second signal S2 is periodically made to have the second voltage VL depending on timing of a change in voltage of the first signal S1 that is detected or measured in advance. Alternatively, after direct-path current is monitored, the second voltage VL is applied at timing based on the appearance frequency of the direct-path current.

In the method for driving a semiconductor device in this embodiment, by turning off the first transistor Tr1 and the second transistor Tr2 at timing of when direct-path current flows to the first CMOS circuit 11, the direct-path current can be reduced (a region of the signal representing the drain current Id_1 that is indicated by an arrow). Thus, the power consumption of the semiconductor device can be reduced.

Here, a structure for reducing direct-path current by adding the first transistor Tr1 to the first CMOS circuit 11 provided between the power supply lines and turning off the first transistor Tr1 is described with reference to FIGS. 3A to 3D.

Figure 3A:
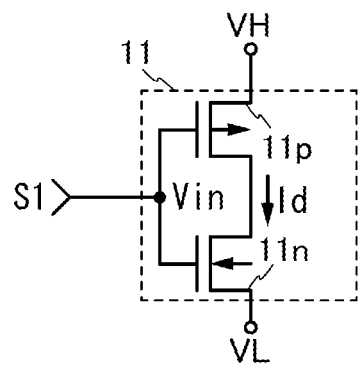
FIGS. 3A to 3D are circuit diagrams and timing charts for describing one embodiment of the present invention.

In a circuit in FIG. 3A, the first transistor Tr1 is not connected to the first CMOS circuit 11 in FIG. 1A. In other words, the circuit structure of the inverter circuit is shown. In the circuit structure in FIG. 3A, for illustrative purposes, the voltage of a gate that is an input terminal is denoted by Vin, and drain current is denoted by Id.

Figure 3C:
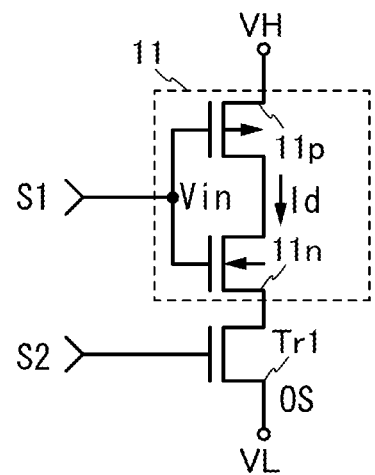
Figure 3B:
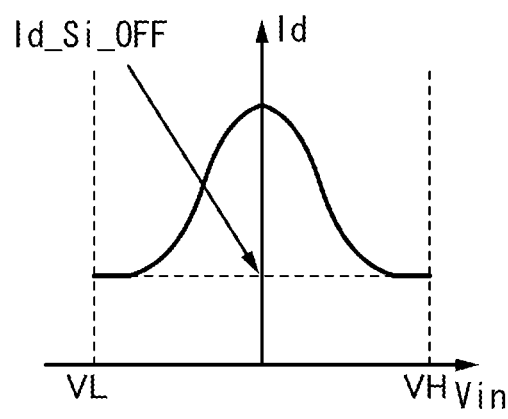

FIG. 3B is a schematic graph where the horizontal axis represents the voltage Vin and the vertical axis represents the drain current Id in the circuit in FIG. 3A.

In the case where the voltage Vin is between the first voltage VH and the second voltage VL, drain current is the highest at intermediate voltage between the first voltage VH and the second voltage VL because the p-channel transistor 11p and the n-channel transistor 11n are turned on as described with reference to FIGS. 2A and 2B.

In the case where the voltage Vin is between the first voltage VH and the second voltage VL, the drain current is the lowest at the first voltage VH or the second voltage VL. The p-channel transistor 11p or the n-channel transistor 11n is turned off as described with reference to FIGS. 2A and 2B; thus, a slight amount of off-state current (indicated by Id_Si_OFF in FIG. 3B) flows when the p-channel transistor 11p or the n-channel transistor 11n is off.

In a circuit in FIG. 3C, the first transistor Tr1 is connected to the first CMOS circuit 11 in FIG. 1A. In the circuit structure in FIG. 3C, for illustrative purposes, the voltage of a gate that is an input terminal is denoted by Vin, and drain current is denoted by Id.

Figure 3D:
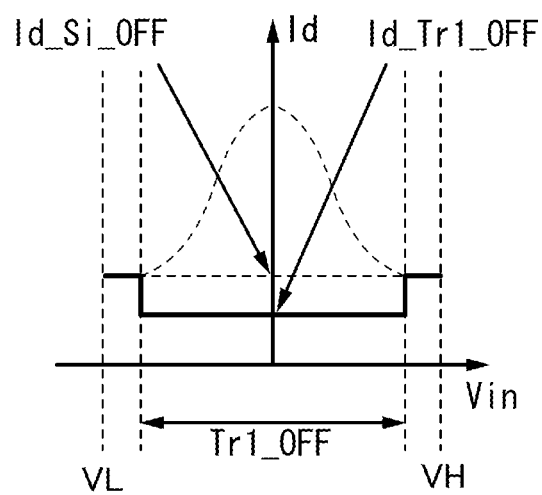

FIG. 3D is a schematic graph where the horizontal axis represents the voltage Vin and the vertical axis represents the drain current Id in the circuit in FIG. 3C. The first transistor Tr1 is turned off to reduce the drain current Id flowing to the first CMOS circuit 11.

In the case where the voltage Vin is between the first voltage VH and the second voltage VL, drain current is the highest at intermediate voltage between the first voltage VH and the second voltage VL. The first transistor Tr1 can be turned off in a period (indicated by Tr1_OFF in FIG. 3D) during which the drain current Id flows by control of the second signal S2 in the circuit in FIG. 3C.

Since the first transistor Tr1 having lower off-state current than the p-channel transistor 11p and the n-channel transistor 11n is turned off, off-state current (indicated by Id_Tr1_OFF in FIG. 3D) can be lower than off-state current (indicated by Id_Si_OFF in FIG. 3D) flowing when the p-channel transistor 11p or the n-channel transistor 11n is off, so that the drain current Id can be further reduced.

The above is the description of the structure for reducing direct-path current.

FIG. 1B is described again. Changes in voltage at the node A and the node B in FIG. 1B correspond to changes in voltage by the first signal S1 and the second signal S2, and signals with waveforms in FIG. 1B can be obtained.

In the method for driving a semiconductor device in this embodiment, by turning off the second transistor Tr2, the amount of change in voltage at the node B can be extremely small as shown in the change in voltage at the node B in FIG. 1B. Thus, in one embodiment of the present invention, the off-state of a transistor enables the voltage of a signal input to an input terminal of the CMOS circuit to be held and enables the charging and discharging number of electric charge to be reduced. Consequently, the power consumption of the semiconductor device can be reduced.

In the method for driving a semiconductor device in this embodiment, by controlling the first transistor Tr1 and the second transistor Tr2 with the same second signal S2, the potential at the node B can be held using the second transistor Tr2 and the capacitor cap in a period during which a change in potential at the node A is not determined Specifically, in FIG. 1B, the potential at the node A is not determined in a period during which the first transistor Tr1 is off, especially, in a period during which the n-channel transistor 11n switches from the off state to the on state. In this embodiment, the first transistor Tr1 and the second transistor Tr2 are concurrently turned off in the period during which the potential at the node A is not determined; thus, the potential at the node B can be held using the second transistor Tr2 and the capacitor cap. By operating the second CMOS circuit with the potential held at the node B, a signal output from the second CMOS circuit can be stable.

Figure 4A:
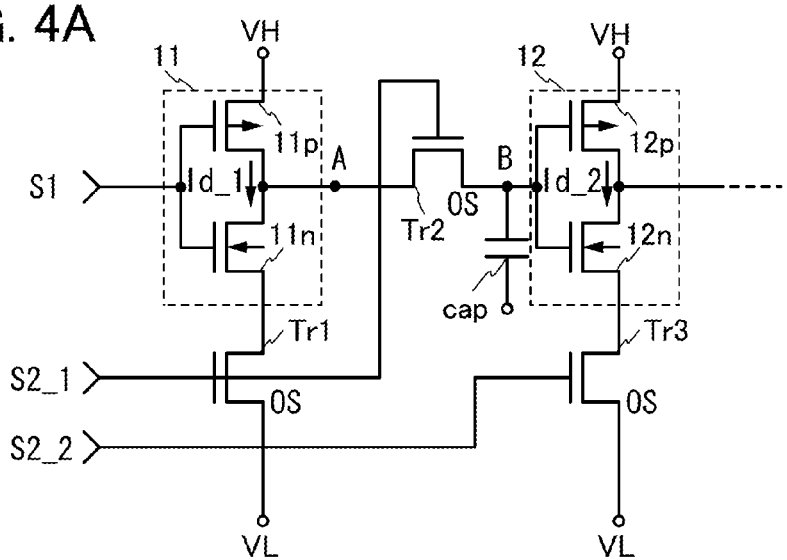
FIGS. 4A and 4B are a circuit diagram and a timing chart for describing one embodiment of the present invention.

Note that the structure for reducing direct-path current by the first transistor Tr1 described with reference to FIGS. 1A and 1B is also applicable to the second CMOS circuit 12 in FIG. 1A. FIG. 4A illustrates a specific circuit structure example. Note that in FIGS. 4A and 4B, portions that are the same as those in FIGS. 1A and 1B are denoted by the same reference numerals, and the description of such portions is omitted by employing the above description.

A semiconductor device in FIG. 4A includes a third transistor Tr3 in addition to the components in FIG. 1A. Note that in the semiconductor device in FIG. 4A, the second signal S2 in FIG. 1A is described as a second signal S2_1, and the second signal S2_1 has the same structure as the second signal S2 in FIG. 1A.

The first voltage VH that is the high power supply potential for supplying power supply voltage to the second CMOS circuit 12 is applied to the second CMOS circuit 12. In addition, the second voltage VL that is the low power supply potential for supplying power supply voltage to the second CMOS circuit 12 is applied to the second CMOS circuit 12 through the third transistor Tr3.

The third transistor Tr3 has lower off-state current than the p-channel transistor 12p and the n-channel transistor 12n included in the second CMOS circuit 12. A transistor including a channel formation region in an oxide semiconductor can be used as a transistor having lower off-state current than the p-channel transistor 12p and the n-channel transistor 12n each including a channel formation region in a silicon layer. Note that the third transistor Tr3 may be an n-channel transistor or a p-channel transistor. In this embodiment, the third transistor Tr3 is an n-channel transistor.

The use of a transistor having low off-state current as the third transistor Tr3 enables a significant reduction in direct-path current when the third transistor Tr3 is turned off.

Note that the third transistor Tr3 may be stacked over the transistors (e.g., the p-channel transistor 12p and the n-channel transistor 12n) included in the second CMOS circuit 12. Such a structure can reduce the circuit area of the semiconductor device.

A second signal S2_2 is input to a gate of the third transistor Tr3. Conduction or non-conduction between one of a source and a drain of the third transistor Tr3 and the other of the source and the drain of the third transistor Tr3 is controlled in response to the second signal S2_2 input to the gate of the third transistor Tr3.

The second signal S2_2 is a signal for controlling the on-state and off-state of the third transistor Tr3. In the case where the third transistor Tr3 is an n-channel transistor as described above, the third transistor Tr3 is turned on when the second signal S2_2 has the first voltage VH, and the third transistor Tr3 is turned off when the second signal S2_2 has the second voltage VL.

A change in amplitude of the voltage of the second signal S2_2 is preferably more rapid than or as rapid as a change in amplitude of the voltage of the first signal S1. For example, the second signal S2_2 may be input to the gate of the third transistor Tr3 through a buffer circuit or the like. In addition, in the case where the third transistor Tr3 functions as a switch, the second signal S2_2 preferably has voltage that is higher than the first voltage VH to turn on the transistor.

Next, a method for driving the semiconductor device in FIG. 4A is described. For illustrative purposes, drain current flowing to the second CMOS circuit 12 is denoted by "Id_2".

Figure 4B:
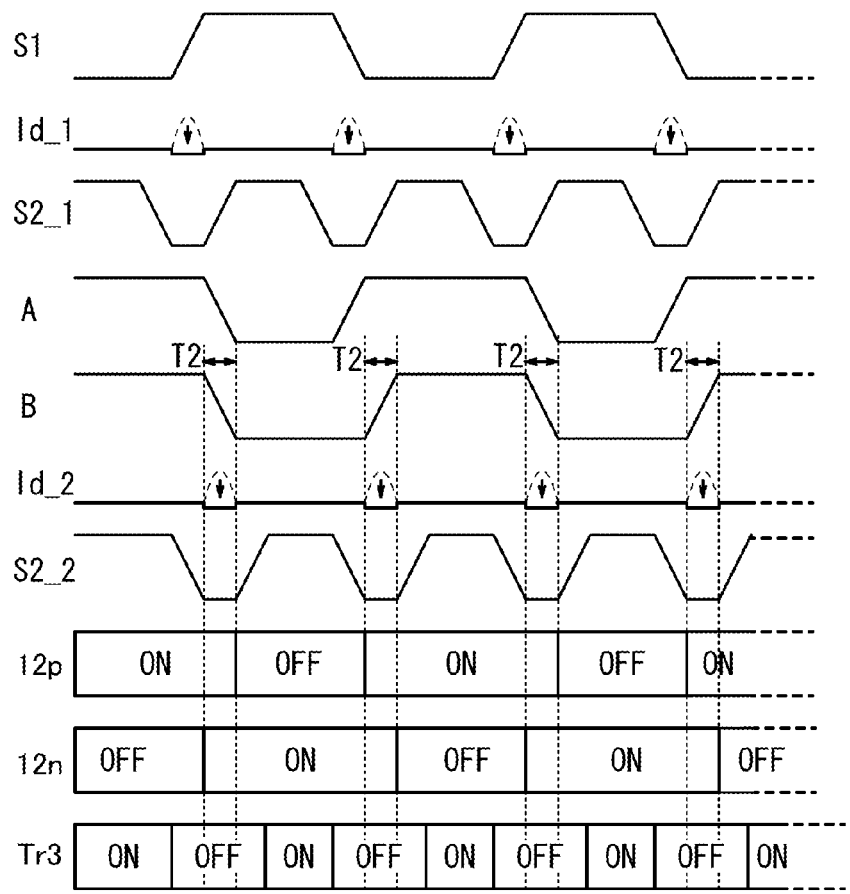

A timing chart in FIG. 4B shows the first signal S1, the drain current Id_1, the second signal S2_1, the signal of the node A, the signal of the node B, the drain current Id_2, the second signal S2_2, the on-state and off-state of the p-channel transistor 12p, the on-state and off-state of the n-channel transistor 12n, and the on-state and off-state of the third transistor Tr3 in FIG. 4A.

The timing chart in FIG. 4B shows a period (period T2) during which the voltage of the signal of the node B is changed slowly. The timing chart in FIG. 4B also shows an increase in the drain current Id_2 in the period during which the voltage is changed (a region of a signal representing the drain current Id_2 that is indicated by a dotted line).

In the method for driving a semiconductor device in this embodiment, in the period T2 in which the drain current Id_2 is increased, the second signal S2_2 is made to have the second voltage VL so that the third transistor Tr3 is turned off; thus, direct-path current generated at the time when the p-channel transistor 12p and the n-channel transistor 12n in the second CMOS circuit 12 are turned on is reduced.

Note that timing of making the second signal S2_2 have the second voltage VL to turn off the third transistor Tr3 may be determined in the following manner. The second signal S2_2 is periodically made to have the second voltage VL depending on timing of a change in voltage of the signal of the node B that is detected or measured in advance. Alternatively, after direct-path current is monitored, the second voltage VL is applied at timing based on the appearance frequency of the direct-path current.

In the method for driving a semiconductor device in this embodiment, by turning off the third transistor Tr3 at timing of when direct-path current flows to the second CMOS circuit 12, the direct-path current can be reduced (a region of the signal representing the drain current Id_2 that is indicated by an arrow). Thus, the power consumption of the semiconductor device can be reduced.

Connections of the first transistor Tr1 to the p-channel transistor 11p and the n-channel transistor 11n included in the first CMOS circuit 11 in FIG. 1A and FIG. 4A can be changed.

Figure 5A:
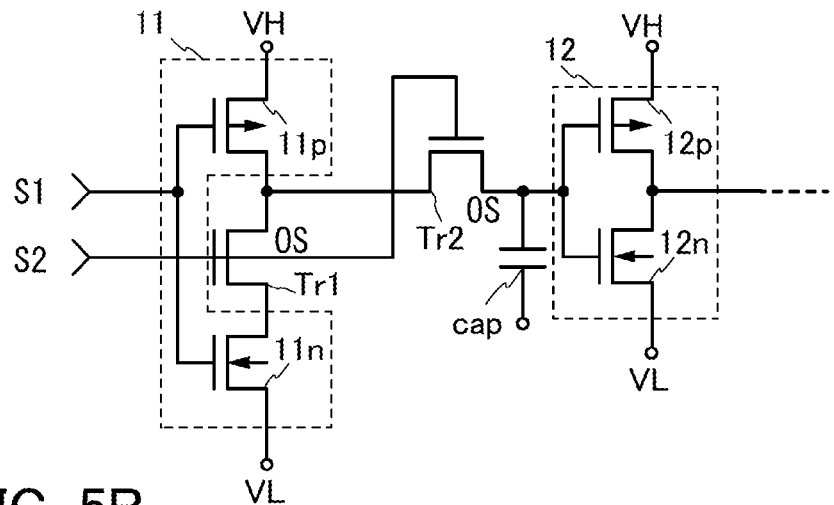
FIGS. 5A to 5C are circuit diagrams for describing one embodiment of the present invention.
Figure 5B:
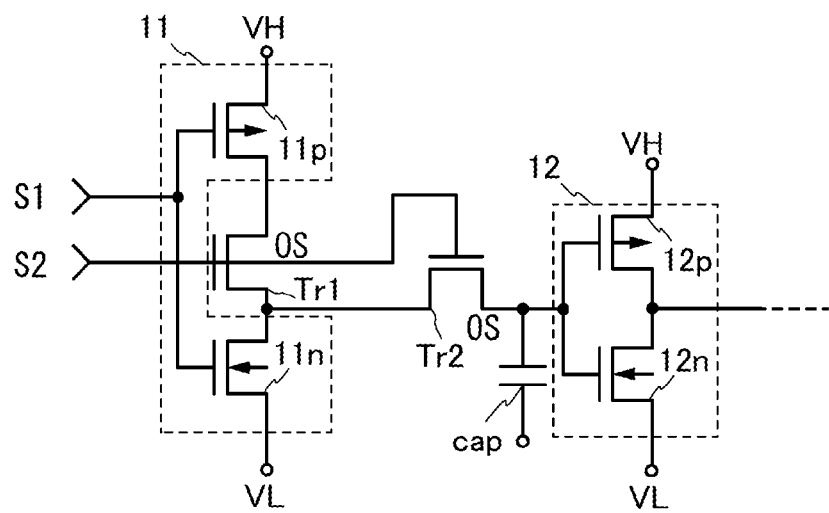
Figure 5C:
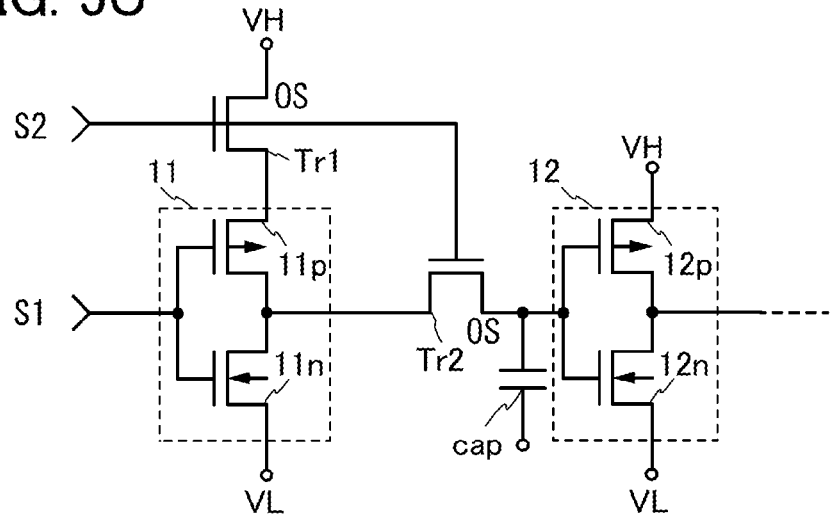

Specifically, by connecting the first transistor Tr1 to the p-channel transistor 11p and the n-channel transistor 11n included in the first CMOS circuit 11 in FIG. 1A and FIG. 4A as illustrated in FIGS. 5A to 5C, the direct-path current can be reduced. Further, with a combination of connections in FIGS. 5A to 5C, the direct-path current can be reduced. Note that in FIGS. 5A to 5C, portions that are the same as those in FIG. 1A are denoted by the same reference numerals, and the description of such portions is omitted by employing the above description.

In a circuit diagram in FIG. 5A, unlike in the connections in FIG. 1A and FIG. 4A, the first transistor Tr1 is provided between the output terminal of the first CMOS circuit 11 and the n-channel transistor 11n of the first CMOS circuit 11.

In a circuit diagram in FIG. 5B, unlike in the connections in FIG. 1A and FIG. 4A, the first transistor Tr1 is provided between the output terminal of the first CMOS circuit 11 and the p-channel transistor 11p of the first CMOS circuit 11.

In a circuit diagram in FIG. 5C, unlike in the connections in FIG. 1A and FIG. 4A, the first transistor Tr1 is provided between the p-channel transistor 11p of the first CMOS circuit 11 and the wiring for applying the first voltage VH to the first CMOS circuit 11.

As illustrated in the circuit diagrams in FIGS. 5A to 5C, the semiconductor device according to one embodiment of the present invention may include the first transistor Tr1 in a portion that serves as a path of direct-path current between power supply lines when the transistors of the first CMOS circuit are driven. Note that operation that is similar to the operation in FIG. 1B may be performed in FIGS. 5A to 5C. In other words, the direct-path current may be reduced by turning off the first transistor Tr1 and the second transistor Tr2 at timing of when the direct-path current flows to the first CMOS circuit 11.

The circuit structures of the first CMOS circuit 11 and the second CMOS circuit 12 in FIG. 1A and FIG. 4A are not limited to inverter circuits. Specifically, a NOR circuit such as a first CMOS circuit 11_NOR in FIG. 6A can be used. The first CMOS circuit 11_NOR includes a p-channel transistor 11p_1, an n-channel transistor 11n_1, a p-channel transistor 11p_2, and an n-channel transistor 11n_2. First signals S1_1 and S1_2 are used as input signals.

Figure 6A:
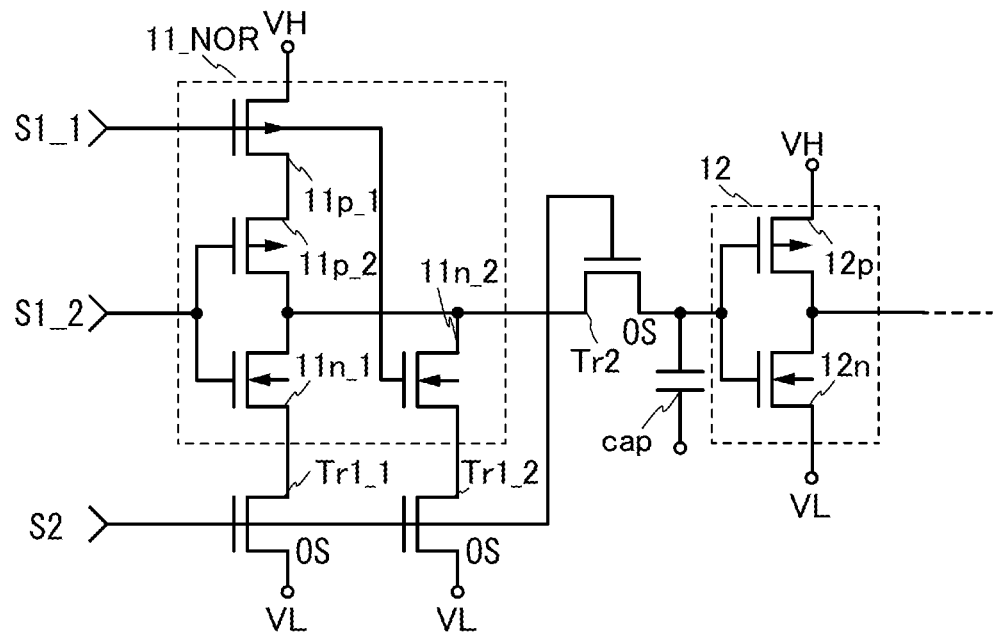
FIGS. 6A and 6B are circuit diagrams for describing one embodiment of the present invention.

Note that as illustrated in FIG. 6A, as first transistors, a first transistor Tr1_1 and a first transistor Tr1_2 may be provided between power supply lines to which direct-path current flows.

Figure 6B:
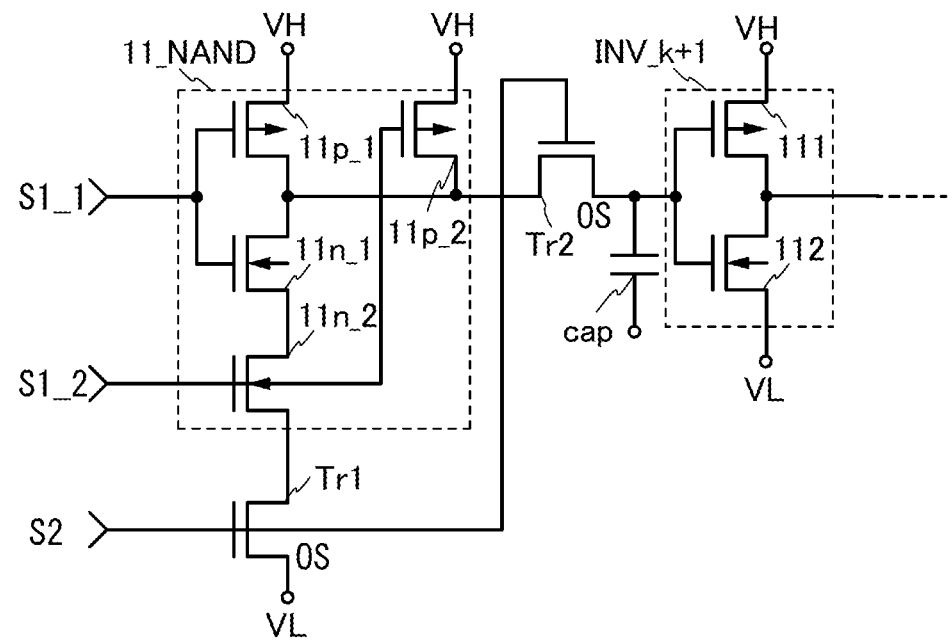

A NAND circuit such as a first CMOS circuit 11_NAND in FIG. 6B can also be used as the first CMOS circuit 11. The first CMOS circuit 11_NAND includes the p-channel transistor 11p_1, the n-channel transistor 11n_1, the p-channel transistor 11p_2, and the n-channel transistor 11n_2. The first signals S1_1 and S1_2 are used as input signals.

Note that operation that is similar to the operation in FIG. 1B may be performed in FIGS. 6A and 6B. In other words, direct-path current may be reduced by turning off the first transistor Tr1 (or the first transistor Tr1_1 and the first transistor Tr1_2) and the second transistor Tr2 at timing of when the direct-path current flows to the first CMOS circuit 11_NOR or the first CMOS circuit 11_NAND.

In the method for driving a semiconductor device in this embodiment, by turning off the transistors having low off-state current at timing of when direct-path current flows to the CMOS circuit, the direct-path current can be reduced. Thus, the power consumption of the semiconductor device can be reduced.

Embodiment 2

In this embodiment, a method for driving a semiconductor device that is different from the method in Embodiment 1 is described.

Figure 7A:
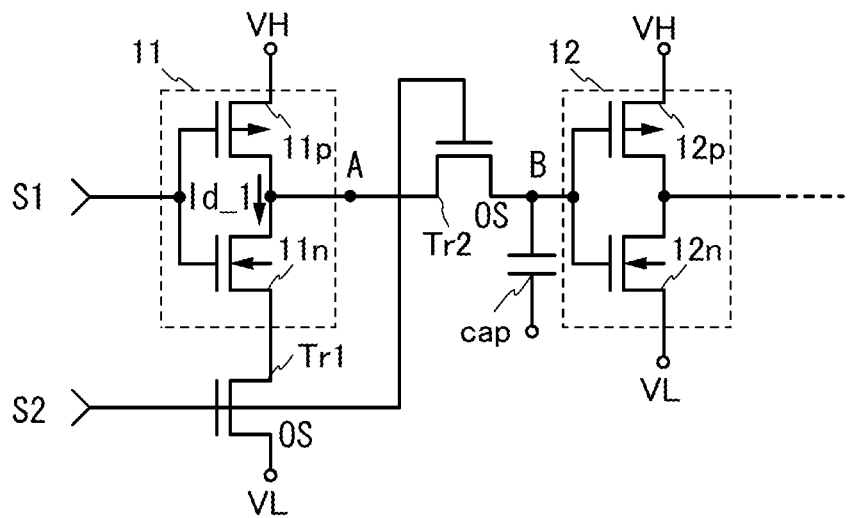
FIGS. 7A and 7B are a circuit diagram and a timing chart for describing one embodiment of the present invention.
Figure 7B:
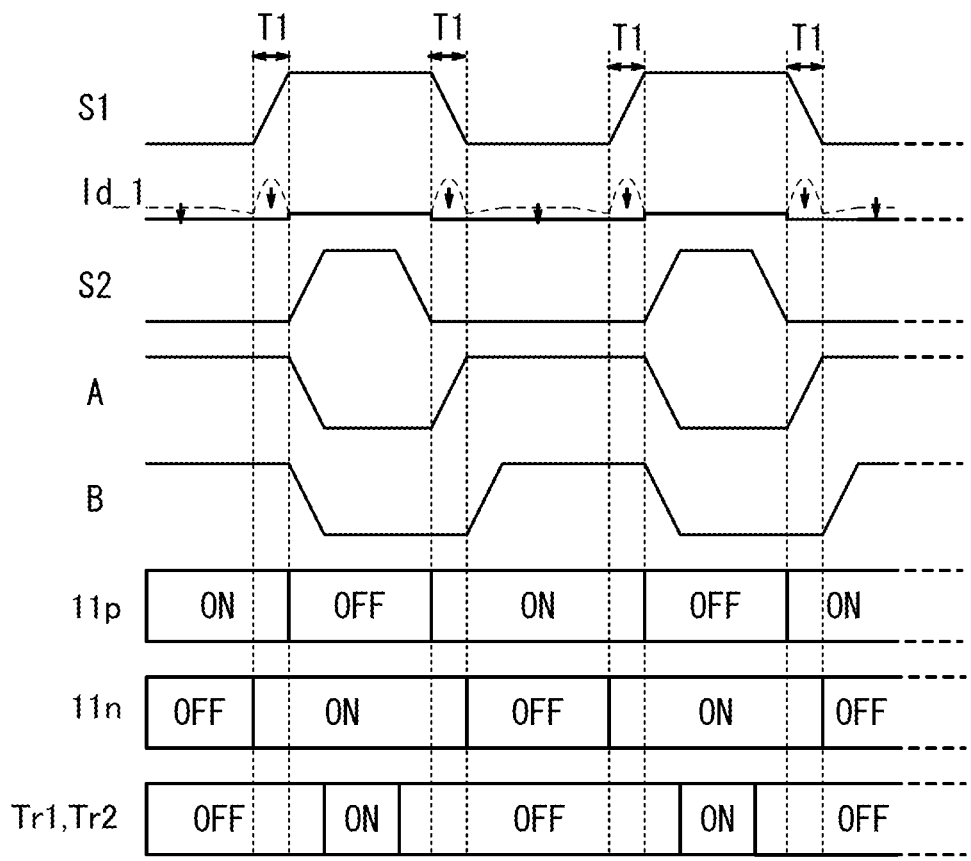

FIG. 7A is a circuit diagram illustrating an example of a semiconductor device in this embodiment. FIG. 7B is a timing chart showing a method for driving the semiconductor device in FIG. 7A.

Note that in FIGS. 7A and 7B, portions that are the same as those in FIGS. 1A and 1B are denoted by the same reference numerals, and the description of such portions is omitted by employing the above description. The semiconductor device in FIG. 7A has the same structure as the semiconductor device in FIG. 1A.

The timing chart in FIG. 7B of this embodiment differs in timing of turning off the first transistor Tr1 and the second transistor Tr2 with the second signal S2 from FIG. 1B.

The timing chart in FIG. 7B shows the period (the period T1) during which the voltage of the first signal S1 is changed slowly. The timing chart in FIG. 7B also shows an increase in the drain current Id_1 in the period during which the voltage is changed (a region of a signal representing the drain current Id_1 that is indicated by a dotted line).

In the method for driving a semiconductor device in this embodiment, in the period T1 in which the drain current Id_1 is increased, the second signal S2 is made to have the second voltage VL so that the first transistor Tr1 and the second transistor Tr2 are turned off; thus, direct-path current generated at the time when the p-channel transistor 11p and the n-channel transistor 11n in the first CMOS circuit 11 are turned on is reduced. In addition, in the method for driving a semiconductor device in this embodiment, the second signal S2 is made to have the second voltage VL when the n-channel transistor 11n of the first CMOS circuit 11 is off so that the first transistor Tr1 and the second transistor Tr2 are turned off; thus, off-state current flowing when the n-channel transistor 11n of the first CMOS circuit 11 is off can be reduced.

Note that timing of making the second signal S2 have the second voltage VL to turn off the first transistor Tr1 and the second transistor Tr2 may be determined in the following manner. The first transistor Tr1 and the second transistor Tr2 are periodically turned off when the n-channel transistor 11n of the first CMOS circuit 11 is off, depending on timing of a change in voltage of the first signal S1 that is detected or measured in advance, taking the timing of making the second signal S2 have the second voltage VL into consideration. Alternatively, after direct-path current is monitored, the second voltage VL is applied when the n-channel transistor 11n of the first CMOS circuit 11 is off, taking timing based on the appearance frequency of the direct-path current into consideration.

In the method for driving a semiconductor device in this embodiment, by turning off the first transistor Tr1 and the second transistor Tr2 at timing of when direct-path current and off-state current flow to the first CMOS circuit 11 and timing of when the n-channel transistor 11n of the first CMOS circuit 11 is off, the direct-path current and the off-state current can be reduced (regions of the signal representing the drain current Id_1 that are indicated by arrows). Thus, the power consumption of the semiconductor device can be reduced.

In the method for driving a semiconductor device in this embodiment, by turning off the second transistor Tr2, the amount of change in voltage at the node B can be extremely small as shown in a change in voltage at the node B in FIG. 7B. Thus, in one embodiment of the present invention, the off-state of a transistor enables the voltage of a signal input to an input terminal of the CMOS circuit to be held and enables the charging and discharging number of electric charge to be reduced. Consequently, the power consumption of the semiconductor device can be reduced.

In the method for driving a semiconductor device in this embodiment, by turning off transistors having low off-state current at timing of when direct-path current flows to the CMOS circuit and timing of when the n-channel transistor 11n of the first CMOS circuit 11 is off, the direct-path current and the off-state current can be reduced. Thus, the power consumption of the semiconductor device can be reduced.

This embodiment can be combined with any of the structures described in the other embodiments as appropriate.

Embodiment 3

In this embodiment, the structures of the first transistor Tr1 and the second transistor Tr2 having lower off-state current than the transistors of the CMOS circuits in Embodiment 1 are described.

Note that the p-channel transistor 11p, the n-channel transistor 11n, the p-channel transistor 12p, the n-channel transistor 12n, and the like of the CMOS circuits in the above embodiment each include a semiconductor layer of silicon, germanium, or the like in an amorphous, microcrystalline, polycrystalline, or signal crystal state as a semiconductor layer used for a channel formation region. Any of the following can be used as silicon: amorphous silicon formed by sputtering or vapor deposition such as plasma-enhanced CVD; polycrystalline silicon obtained in such a manner that amorphous silicon is crystallized by laser annealing or the like; single crystal silicon obtained in such a manner that a surface portion of a single crystal silicon wafer is separated by implantation of hydrogen ions or the like into the silicon wafer; and the like.

It is preferable to use an oxide semiconductor for semiconductor layers used for channel formation regions of the first transistor Tr1 and the second transistor Tr2 having low off-state current. In the case where an oxide semiconductor layer is used as a semiconductor layer used for a channel formation region, the concentration of hydrogen in the oxide semiconductor layer is lowered and the oxide semiconductor layer is highly purified, so that it is possible to form a transistor having extremely low off-state current.

An example of a transistor whose channel formation region is formed in an oxide semiconductor layer is described below with reference to drawings.

<Example of Transistor Whose Channel Formation Region is Formed in Oxide Semiconductor Layer>

Figure 8:
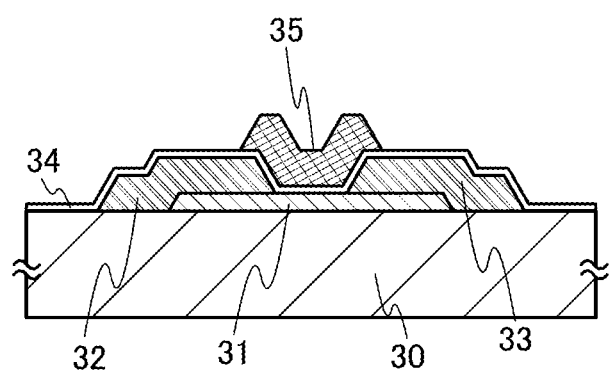
FIG. 8 is a cross-sectional schematic view illustrating a structure example of a transistor.

FIG. 8 illustrates a structure example of a transistor whose channel formation region is formed in an oxide semiconductor layer. The transistor in FIG. 8 includes an oxide semiconductor layer 31 provided over a layer 30 having an insulating surface, a conductive layer 32 that is in contact with one end of the oxide semiconductor layer 31, a conductive layer 33 that is in contact with the other end of the oxide semiconductor layer 31, an insulating layer 34 provided over the oxide semiconductor layer 31 and the conductive layers 32 and 33, and a conductive layer 35 provided over the insulating layer 34. Note that in the transistor in FIG. 8, the conductive layers 32 and 33 function as a source and a drain, the insulating layer 34 functions as a gate insulating film, and the conductive layer 35 functions as a gate.

<1. Specific Example of Oxide Semiconductor Layer 31>
<(1) Oxide Semiconductor Material>

A film containing at least indium can be used as the oxide semiconductor layer 31. In particular, a film containing indium and zinc is preferably used. As a stabilizer for reducing variations in electrical characteristics of the transistor, a film containing gallium in addition to indium and zinc is preferably used.

Alternatively, a film which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the oxide semiconductor layer 31.

For the oxide semiconductor layer 31, for example, a thin film of any of the following can be used: indium oxide, an In—Zn-based oxide, an In—Mg-based oxide, an In—Ga-based oxide, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, an In—Ga—Zn-based oxide means an oxide whose main components are In, Ga, and Zn, and there is no limitation on the ratio of In, Ga, and Zn. The In—Ga—Zn-based oxide may contain a metal element other than In, Ga, and Zn.

Note that part of oxygen included in the oxide semiconductor layer 31 may be substituted with nitrogen.

<(2) Crystal Structure of Oxide Semiconductor>

The oxide semiconductor layer 31 is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor including the CAAC-OS film, changes in electrical characteristics of the transistor due to irradiation with visible light or ultraviolet light are small. Thus, the transistor has high reliability.

<(3) Layer Structure of Oxide Semiconductor>

For the oxide semiconductor layer 31, not only a single-layer oxide semiconductor film but also a stack of plural kinds of oxide semiconductor films can be used. For example, a layer including at least two of an amorphous oxide semiconductor film, a polycrystalline oxide semiconductor film, and a CAAC-OS film can be used as the oxide semiconductor layer 31.

Alternatively, a stack of oxide semiconductor films having different compositions can be used for the oxide semiconductor layer 31. Specifically, a layer including a first oxide semiconductor film (hereinafter also referred to as an upper layer) which is provided on the insulating layer 34 side and a second oxide semiconductor film (hereinafter also referred to as a lower layer) which is provided on the layer 30 having an insulating surface side and has a composition different from the first oxide semiconductor film can be used as the oxide semiconductor layer 31.

<2. Specific Example of Conductive Layers 32 and 33>

For the conductive layers 32 and 33, a film containing an element selected from aluminum, copper, titanium, tantalum, tungsten, molybdenum, chromium, neodymium, or scandium, a film of an alloy containing any of these elements, a film of a nitride containing any of these elements, or the like can be used. Alternatively, a stack of these films can be used.

<3. Specific Example of Insulating Layer 34>

For the insulating layer 34, an inorganic insulating material film such as a silicon oxide film, a silicon nitride film, a silicon oxynitride film, a silicon nitride oxide film, an aluminum oxide film, an aluminum oxynitride film, or a gallium oxide film can be used. Alternatively, a stack of layers of these materials can be used. Note that an aluminum oxide film is preferably used for the insulating layer 34. An aluminum oxide film has a high shielding (blocking) effect of preventing penetration of oxygen and an impurity such as hydrogen. Thus, when the layer including an aluminum oxide film is used as the insulating layer 34, it is possible to prevent release of oxygen from the oxide semiconductor layer 31 and entry of an impurity such as hydrogen into the oxide semiconductor layer 31.

For the insulating layer 34, a film including a hafnium oxide film, an yttrium oxide film, a hafnium silicate (HfSi$_x$O$_y$, (x>0, y>0)) film, a hafnium silicate film to which nitrogen is added, a hafnium aluminate (HfAl$_x$O$_y$, (x>0, y>0)) film, a lanthanum oxide film (i.e., a film formed of what is called a high-k material), or the like can be used. The use of such a film can reduce gate leakage current.

<4. Specific Example of Conductive Layer 35>

For the conductive layer 35, a film containing an element selected from aluminum, copper, titanium, tantalum, tungsten, molybdenum, chromium, neodymium, or scandium or a film of an alloy containing any of these elements as its component can be used. Alternatively, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used for the conductive layer 35. Such a nitride film has a work function of 5 eV (electron volts) or higher, preferably 5.5 eV or higher. When this film is used as the gate, the threshold voltage of a transistor can be shifted in a positive direction; thus, what is called a normally-off switching element can be provided. Alternatively, a stack of these films can be used.

<5. Supplementary Note>

In the transistor in FIG. 8, it is preferable to inhibit entry of impurities into the oxide semiconductor layer 31 and release of constituent elements of the oxide semiconductor layer 31. This is because the electrical characteristics of the transistor are changed when such a phenomenon occurs. As a means for inhibiting this phenomenon, insulating layers having a high blocking effect are provided above and below the transistor (between the layer 30 having an insulating surface and the transistor, and over the insulating layer 34 and the conductive layer 35). For example, the insulating layers can be formed using an inorganic insulating material film such as a silicon oxide film, a silicon nitride film, a silicon oxynitride film, a silicon nitride oxide film, an aluminum oxide film, an aluminum oxynitride film, or a gallium oxide film. Alternatively, a stack of layers of these materials can be used.

In a semiconductor device that is operated by the method for driving a semiconductor device in the above embodiment, leakage current and off-state current between power supply lines can be greatly reduced by using the transistor in this embodiment. Thus, the power consumption of the semiconductor device in this embodiment can be reduced.

Embodiment 4

In this embodiment, examples of a structure and a manufacturing method of a semiconductor device including a transistor 902 whose channel formation region is formed in an oxide semiconductor layer and a transistor 901 whose channel formation region is formed in a single crystal silicon wafer are described with reference to FIG. 9. Note that the transistor 901 can be used as the p-channel transistor 11p, the n-channel transistor 11n, the p-channel transistor 12p, the n-channel transistor 12n, or the like in Embodiment 1, and the transistor 902 can be used as the first transistor Tr1, the second transistor Tr2, or the like in Embodiment 1.

Figure 9:
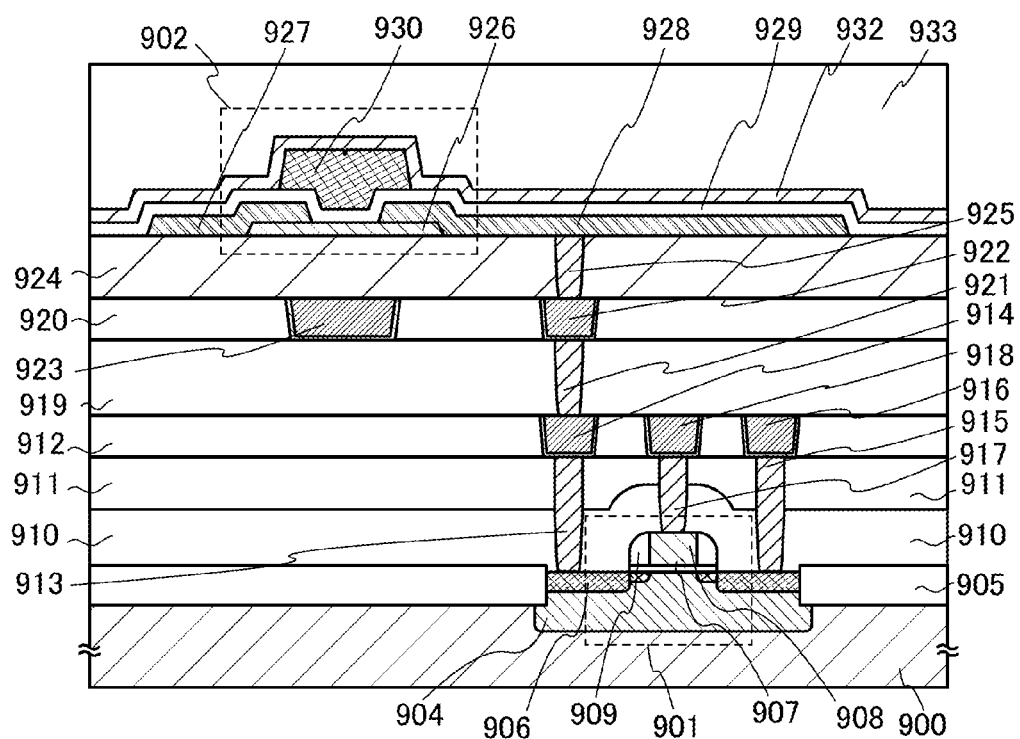
FIG. 9 is a cross-sectional schematic view illustrating structure examples of transistors.

In a semiconductor device in FIG. 9, the transistor 901 using a single crystal silicon wafer is formed, and the transistor 902 including an oxide semiconductor is formed above the transistor 901. In other words, the semiconductor device in this embodiment is a semiconductor device that has a three-dimensional layered structure in which a silicon wafer is used as a substrate and a transistor layer is provided above the silicon wafer. Further, the semiconductor device in this embodiment is a hybrid semiconductor device including a transistor in which silicon is used for a channel formation region and a transistor in which an oxide semiconductor is used for a channel formation region.

Either an n-channel transistor or a p-channel transistor can be used as the transistor 901 formed using a substrate 900 containing a semiconductor material. In the example illustrated in FIG. 9, the transistor 901 is electrically isolated from other elements by a shallow trench isolation (STI) 905. In the substrate 900 where the transistor 901 is formed, a well 904 to which an impurity imparting conductivity, such as boron, phosphorus, or arsenic, is added is formed.

The transistor 901 in FIG. 9 includes a channel formation region in the substrate 900, impurity regions 906 (also referred to as a source region and a drain region) provided such that the channel formation region is placed therebetween, an insulating layer 907 functioning as a gate insulating film over the channel formation region, and a conductive layer 908 functioning as a gate provided over the insulating layer 907 to overlap with the channel formation region. The material, the number of stacked layers, the shape, and the like of each of the insulating layer 907 and the conductive layer 908 can be adjusted as appropriate depending on required specifications.

Contact plugs 913 and 915 are connected to the impurity regions 906 in the substrate 900. Further, a contact plug 917 is connected to the conductive layer 908. Here, the contact plugs 913 and 915 also function as a source electrode and a drain electrode of the transistor 901 to which the contact plugs 913 and 915 are connected. In addition, impurity regions that are different from the impurity regions 906 and function as LDD regions or extension regions are provided between the impurity regions 906 and the channel formation region. Insulating layers 909 functioning as sidewalls are provided at side surfaces of the conductive layer 908. By using the insulating layers 909, the LDD regions or the extension regions can be formed.

The transistor 901 is covered with an insulating layer 910. The insulating layer 910 can function as a protective film and can prevent impurities from entering the channel formation region from the outside. An insulating layer 911 whose surface is flattened by chemical mechanical polishing (CMP) is provided over the insulating layer 910.

A tier including the transistor 902 whose channel formation region is formed in an oxide semiconductor layer is formed above a tier including the transistor 901. The transistor 902 is a top-gate transistor. The transistor 902 includes conductive layers 927 and 928 that are in contact with side surfaces and an upper surface of an oxide semiconductor layer 926 and function as a source electrode and a drain electrode, and a conductive layer 930 that functions as a gate electrode over an insulating layer 929 that functions as a gate insulating film and is provided over the oxide semiconductor layer 926 and the conductive layers 927 and 928. Insulating layers 932 and 933 are formed to cover the transistor 902. Here, a method for forming the transistor 902 is described below.

The oxide semiconductor layer 926 is formed over an insulating layer 924 functioning as a layer having an insulating surface. The insulating layer 924 can be formed using an inorganic insulating film of silicon oxide, silicon nitride, silicon nitride oxide, silicon oxynitride, aluminum oxide, aluminum nitride, aluminum nitride oxide, or the like. In this embodiment, the insulating layer 924 is a stack of a silicon oxide film with a thickness of about 300 nm on a 50-nm-thick aluminum oxide film.

The oxide semiconductor layer 926 can be formed by processing an oxide semiconductor film formed over the insulating layer 924 into a desired shape. The thickness of the oxide semiconductor film is 2 to 200 nm, preferably 3 to 50 nm, more preferably 3 to 20 nm. The oxide semiconductor film is deposited by sputtering using an oxide semiconductor target. Further, the oxide semiconductor film can be formed by sputtering under a rare gas (e.g., argon) atmosphere, an oxygen atmosphere, or a mixed atmosphere of a rare gas (e.g., argon) and oxygen. In this embodiment, a 30-nm-thick In—Ga—Zn-based oxide semiconductor thin film obtained by sputtering using a target containing indium (In), gallium (Ga), and zinc (Zn) is used for the oxide semiconductor layer 926.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100 to 600° C., preferably 200 to 400° C. in deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A hydrogen atom, a compound containing a hydrogen atom, such as water ($H_2O$), and the like are exhausted from the treatment chamber with the use of a cryopump. Thus, the concentration of impurities contained in the oxide semiconductor film deposited in the treatment chamber can be lowered.

Note that in order that hydrogen, a hydroxyl group, and moisture be contained in the oxide semiconductor layer 926 as little as possible, it is preferable that an impurity such as hydrogen or moisture that is adsorbed on the substrate 900 be released and exhausted by preheating of the substrate 900 over which the insulating layer 924 is formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted.

Note that etching for forming the oxide semiconductor layer 926 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. As the dry etching, parallel plate reactive ion etching (RIE) or inductively coupled plasma (ICP) etching can be used.

Note that the oxide semiconductor deposited by sputtering or the like contains a large amount of moisture or hydrogen (including a hydroxyl group) as an impurity in some cases. Moisture or hydrogen easily forms a donor level and thus serve as an impurity in the oxide semiconductor. Thus, in this embodiment, in order to reduce impurities such as moisture or hydrogen in the oxide semiconductor (in order to perform dehydration or dehydrogenation), the oxide semiconductor layer 926 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

By performing heat treatment on the oxide semiconductor layer 926, moisture or hydrogen in the oxide semiconductor layer 926 can be released. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Through the above steps, the concentration of hydrogen in the oxide semiconductor layer 926 can be lowered and the oxide semiconductor layer 926 can be highly purified. Accordingly, the oxide semiconductor film can be stabilized. Further, with the use of the highly purified oxide semiconductor film in which the hydrogen concentration is lowered, it is possible to form a transistor with high withstand voltage and extremely low off-state current.

Next, the conductive layers 927 and 928 functioning as a source electrode and a drain electrode are formed by a photolithography process. Specifically, the conductive layers 927 and 928 can be formed in such a manner that a conductive film is formed over the insulating layer 924 by sputtering or vacuum vapor deposition and then processed (patterned) into a predetermined shape. In this embodiment, a 100-nm-thick tungsten film is used for the conductive layers 927 and 928.

Note that when the conductive film is etched, the material and etching conditions are adjusted as appropriate so that the oxide semiconductor layer 926 is removed as little as possible. Depending on the etching conditions, an exposed portion of the oxide semiconductor layer 926 is partly etched and thus a groove (a depression portion) is formed in some cases.

Next, plasma treatment is performed using a gas such as $N_2O$, $N_2$, or Ar. With this plasma treatment, water and the like which attach to a surface of the oxide semiconductor film exposed are removed. Alternatively, plasma treatment may be performed using a mixture gas of oxygen and argon. After the plasma treatment, the insulating layer 929 functioning as a gate insulating film is formed to cover the conductive layers 927 and 928 and the oxide semiconductor layer 926. Then, over the insulating layer 929, the conductive layer 930 functioning as a gate electrode is formed to overlap with the oxide semiconductor layer 926.

In this embodiment, a 20-nm-thick silicon oxynitride film formed by sputtering is used as the insulating layer 929. The substrate temperature in deposition is in the range of room temperature to 400° C., and is 300° C. in this embodiment.

After the insulating layer 929 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the content of water in the gas be 20 ppm or lower, preferably 1 ppm or lower, more preferably 10 ppb or lower.

Alternatively, oxygen vacancies that serve as donors in the oxide semiconductor layer 926 may be reduced by performing heat treatment on the oxide semiconductor layer 926 in an oxygen atmosphere so that oxygen is added to the oxide semiconductor. The heat treatment is performed at, for example, higher than or equal to 100° C. and lower than 350° C., preferably higher than or equal to 150° C. and lower than 250° C.

The conductive layer 930 can be formed in such a manner that a conductive film is formed over the insulating layer 929 and then is patterned.

The thickness of the conductive layer 930 is 10 to 400 nm, preferably 100 to 300 nm. In this embodiment, the conductive layer 930 is formed in the following manner: a 135-nm-thick tungsten film is stacked over a 30-nm-thick tantalum nitride film by sputtering to form a conductive film for the gate electrode, and then, the conductive film is processed (patterned) into a desired shape by etching.

Through the above steps, the transistor 902 is formed.

Note that in this embodiment, the transistor 902 has a top-gate structure. The transistor 902 includes a conductive layer 923 functioning as a backgate electrode. In the case where the transistor 902 includes a backgate electrode, the transistor 902 can be surely a normally-off transistor. For example, when the potential of the conductive layer 923 is set at GND or a fixed potential, the threshold voltage of the transistor 902 can be further shifted in a positive direction, and the transistor 902 can be further a normally-off transistor.

In order to electrically connect the transistor 901 to the transistor 902 to form an electric circuit, one or more wiring layers for connecting these elements are stacked between tiers and on the upper layer.

In FIG. 9, one of a source and a drain of the transistor 901 is connected to the conductive layer 928 of the transistor 902 through the contact plug 913, a wiring layer 914, a wiring layer 918, a contact plug 921, a wiring layer 922, and a contact plug 925. The other of the source and the drain of the transistor 901 is connected to the wiring layer 916 through the contact plug 915. A gate of the transistor 901 is connected to the wiring layer 918 through a contact plug 917.

The wiring layers 914, 916, 918, and 922 and the conductive layer 923 functioning as a backgate electrode are embedded in insulating films. These wiring layers and the like are preferably formed using a low-resistance conductive material such as copper or aluminum. By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example.

The insulating layers 911, 912, 919, 920, and 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), silicon oxide made from $Si(OC_2H_5)_4$ (tetraethylorthosilicate: TEOS), hydrogen silsesquioxane (HSQ), methyl silsesquioxane (MSQ), organosilicate glass (OSG), or an organic polymer-based material. The insulating films are formed by sputtering, CVD, a coating method including spin coating (also referred to as spin on glass (SOG)), or the like.

An insulating film functioning as an etching stopper for flattening treatment by CMP or the like that is performed after the wiring material is embedded in the insulating layers 911, 912, 919, 920, and 933 may be additionally provided.

Each of the contact plugs 913, 915, 917, 921, and 925 is formed in such a manner that an opening (a via hole) with a high aspect ratio is formed in the insulating film and is filled with a conductive material such as tungsten. The opening is preferably formed by highly anisotropic dry etching. In particular, reactive ion etching (RIE) is preferably used. A barrier film (a diffusion prevention film) that is a titanium film, a titanium nitride film, a stack of such films, or the like is formed on an inner wall of the opening and a material such as tungsten or polysilicon doped with phosphorus is embedded in the barrier film.

In a semiconductor device that is operated by the method for driving a semiconductor device in the above embodiment, leakage current and off-state current between power supply lines can be greatly reduced by using the transistor in this embodiment. Thus, the power consumption of the semiconductor device in this embodiment can be reduced. When transistors whose semiconductor layers are formed using different materials are provided in different tiers, the transistors can overlap with each other. Thus, the circuit area of the semiconductor device can be reduced, so that the semiconductor device can be downsized.

Embodiment 5

In this embodiment, examples of a semiconductor device constituted of the plurality of semiconductor devices in Embodiment 1 and operation of the semiconductor device are described.

Figure 10:
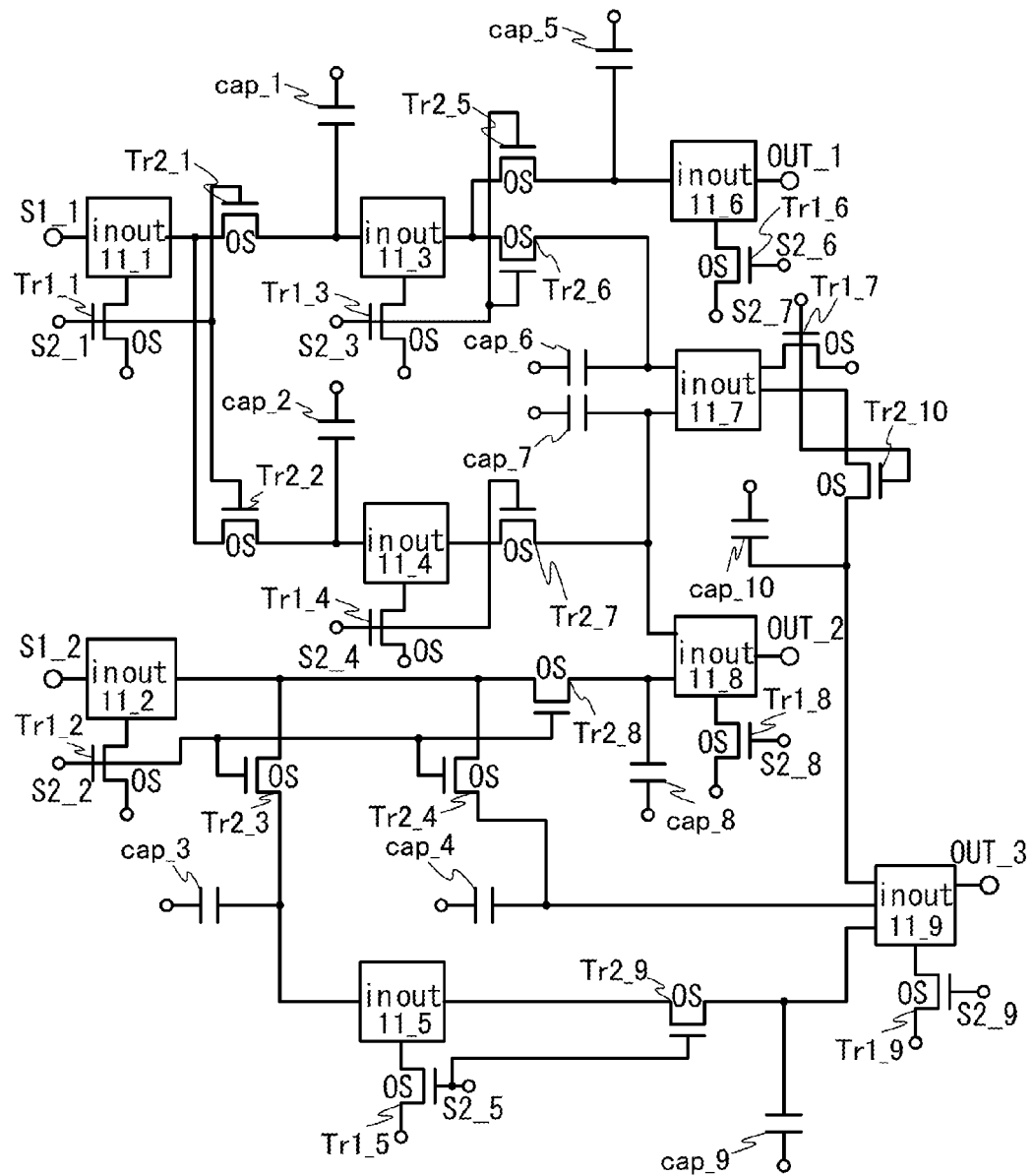
FIG. 10 illustrates an example of a semiconductor device.

FIG. 10 is a conceptual diagram illustrating the structure of the semiconductor device in this embodiment. The semiconductor device in FIG. 10 includes a plurality of CMOS circuits 11_1 to 11_9, a plurality of first transistors Tr1_1 to Tr1_9 provided between power supply lines (not illustrated) for supplying power supply voltage to the CMOS circuits 11_1 to 11_9, a plurality of second transistors Tr2_1 to Tr2_10 provided between input terminals in and output terminals out of the plurality of CMOS circuits 11_1 to 11_9, and a plurality of capacitors cap_1 to cap_10. One electrodes of the plurality of capacitors cap_1 to cap_10 are connected to the input terminals of the CMOS circuits 11_1 to 11_9.

Note that FIG. 10 illustrates an example in which the first signals S1_1 and S1_2 in Embodiment 1 are input to the CMOS circuits 11_1 and 11_2, respectively. In FIG. 10, the first signals S1_1 and S1_2 are input to the semiconductor device through input-output of the plurality of CMOS circuits 11_1 to 11_9 and then are obtained as output signals OUT_1 to OUT_3 from the output terminals of the CMOS circuits 11_6, 11_8, and 11_9. In addition, in FIG. 10, second signals S2_1 to S2_9 each corresponding to the second signal S2 in Embodiment 1 are input to gates of the plurality of first transistors Tr1_1 to Tr1_9 and the plurality of second transistors Tr2_1 to Tr2_10.

Note that it is possible to use a transistor that can be used as the first transistor Tr1 in Embodiment 1 as each of the first transistors Tr1_1 to Tr1_9. In addition, it is possible to use a transistor that can be used as the second transistor Tr2 in Embodiment 1 as each of the second transistors Tr2_1 to Tr2_10.

In the semiconductor device in FIG. 10, in a period during which the voltage of signals (including the first signals S1_1 and S1_2) input to the input terminals of the plurality of CMOS circuits 11_1 to 11_9 is changed, a period during which the plurality of first transistors Tr1_1 to Tr1_9 and the plurality of second transistors Tr2_1 to Tr2_10 are turned off by the second signals S2_1 to S2_9 can be provided.

As described in Embodiment 1, in a semiconductor device that is operated by a method for driving a semiconductor device according to one embodiment of the present invention, provision of a period during which the first transistors Tr1_1 to Tr1_9 are off can greatly reduce leakage current and off-state current between power supply lines. Thus, the power consumption of the semiconductor device in this embodiment can be reduced.

In addition, as described in Embodiment 1, in the semiconductor device that is operated by the method for driving a semiconductor device according to one embodiment of the present invention, a period during which the second transistors Tr2_1 to Tr2_10 are off is provided. The first transistors Tr1_1 to Tr1_9 and the plurality of second transistors Tr2_1 to Tr2_10 have lower off-state current than transistors included in the plurality of CMOS circuits 11_1 to 11_9. Thus, by turning off the second transistors Tr2_1 to Tr2_10, electric charge can be held in nodes where the input terminals of the plurality of CMOS circuits 11_1 to 11_9, the second transistors Tr2_1 to Tr2_10, and the plurality of capacitors cap_1 to cap_10 are connected.

Figure 11:
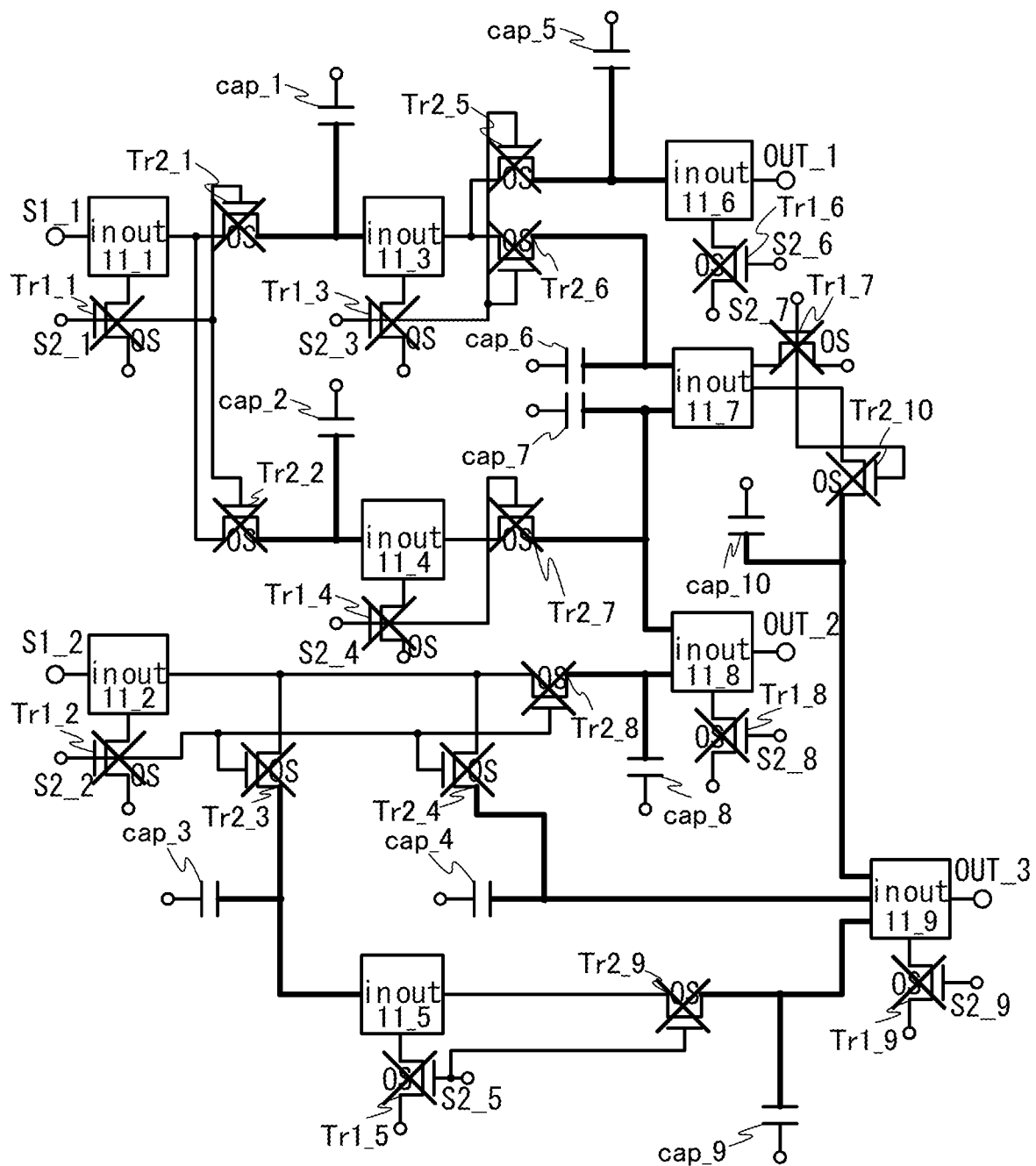
FIG. 11 illustrates an example of a semiconductor device.

For example, in the semiconductor device that is operated by the method for driving a semiconductor device according to one embodiment of the present invention, the plurality of first transistors Tr1_1 to Tr1_9 and the plurality of second transistors Tr2_1 to Tr2_10 are turned off (indicated by crosses in FIG. 11) by the second signals S2_1 to S2_9, as illustrated in FIG. 11. Further, in the semiconductor device that is operated by the method for driving a semiconductor device according to one embodiment of the present invention, electric charge in nodes where wirings are indicated by thick lines in FIG. 11 can be held in the period during which the second transistors Tr2_1 to Tr2_10 are off.

By partly stopping the supply of power supply voltage as illustrated in FIG. 11, power consumption can be reduced and operation can be restarted with little delay after the supply of power supply voltage is restarted.

The semiconductor device constituted of the plurality of semiconductor devices in Embodiment 1 can greatly reduce leakage current and off-state current between power supply lines. Further, the semiconductor device can hold the voltage of signals input to the input terminals of the CMOS circuits and can reduce the charging and discharging number of electric charge. Thus, the power consumption of the semiconductor device in this embodiment can be reduced.

Embodiment 6

A semiconductor device according to one embodiment of the present invention can be used for electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of consumer products among such electronic devices are display devices, personal computers, and image reproducing devices provided with recording media (devices that reproduce the content of recording media such as digital versatile discs (DVDs) and have displays for displaying the reproduced images). Other examples of electronic devices that can include the semiconductor device according to one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 12A to 12F illustrate specific examples of these electronic devices.

FIG. 12A illustrates a portable game machine. The portable game machine in FIG. 12A includes a housing 5001, a housing 5002, a display portion 5003, a display portion 5004, a microphone 5005, a speaker 5006, an operation key 5007, a stylus 5008, and the like. Note that although the portable game machine in FIG. 12A includes the two display portions 5003 and 5004, the number of display portions included in the portable game machine is not limited thereto.

FIG. 12B illustrates a laptop. The laptop in FIG. 12B includes a housing 5401, a display portion 5402, a keyboard 5403, a pointing device 5404, and the like.

FIG. 12C illustrates a video camera. The video camera in FIG. 12C includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

FIG. 12D illustrates a portable information terminal. The portable information terminal in FIG. 12D includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel portion of a display device.

FIG. 12E illustrates an electric refrigerator-freezer. The electric refrigerator-freezer in FIG. 12E includes a housing 5301, a refrigerator door 5302, a freezer door 5303, and the like.

FIG. 12F illustrates an ordinary motor vehicle. The ordinary motor vehicle in FIG. 12F includes a car body 5101, wheels 5102, a dashboard 5103, lights 5104, and the like.

In an electronic device including a semiconductor device that is operated by the method for driving a semiconductor device in the above embodiment, leakage current and off-state current between power supply lines can be greatly reduced. Thus, the power consumption of the electronic device described in this embodiment can be reduced.

This application is based on Japanese Patent Application serial No. 2012-177863 filed with Japan Patent Office on Aug. 10, 2012, the entire contents of which are hereby incorporated by reference.

What is claimed is:
1. A semiconductor device comprising:
   a first transistor;
   a second transistor;
   a third transistor;
   a fourth transistor;
   a fifth transistor; and
   a sixth transistor,
   wherein the third transistor and the fourth transistor have different conductivity types,
   wherein the fifth transistor and the sixth transistor have different conductivity types,
   wherein the first transistor and the second transistor each have lower off-state current than the third transistor, the fourth transistor, the fifth transistor, and the sixth transistor,
   wherein a gate of the third transistor is electrically connected to a gate of the fourth transistor,
   wherein one of a source and a drain of the third transistor is electrically connected to a first power supply line,
   wherein the other of the source and the drain of the third transistor is electrically connected to one of a source and a drain of the fourth transistor and one of a source and a drain of the second transistor,
   wherein the other of the source and the drain of the fourth transistor is electrically connected to one of a source and a drain of the first transistor,
   wherein the other of the source and the drain of the first transistor is electrically connected to a second power supply line,
   wherein a gate of the first transistor is electrically connected to a gate of the second transistor,
   wherein the other of the source and the drain of the second transistor is electrically connected to a gate of the fifth transistor and a gate of the sixth transistor,
   wherein one of a source and a drain of the fifth transistor is electrically connected to the first power supply line,
   wherein the other of the source and the drain of the fifth transistor is electrically connected to one of a source and a drain of the sixth transistor, and
   wherein the other of the source and the drain of the sixth transistor is electrically connected to the second power supply line.
2. The semiconductor device according to claim 1 further comprising a capacitor,
   wherein the capacitor is electrically connected to the other of the source and the drain of the second transistor, the gate of the fifth transistor, and the gate of the sixth transistor.
3. The semiconductor device according to claim 1,
   wherein the third transistor and the fifth transistor are p-channel transistors, and
   wherein the fourth transistor and the sixth transistor are n-channel transistors.
4. The semiconductor device according to claim 1,
   wherein the third transistor and the fifth transistor are n-channel transistors, and
   wherein the fourth transistor and the sixth transistor are p-channel transistors.
5. The semiconductor device according claim 1, wherein the first transistor and the second transistor each include an oxide semiconductor layer including a channel formation region.
6. A semiconductor device comprising:
   a first transistor;
   a second transistor;
   a third transistor;
   a fourth transistor;
   a fifth transistor; and
   a sixth transistor,
   wherein the third transistor and the fourth transistor have different conductivity types,
   wherein the fifth transistor and the sixth transistor have different conductivity types,
   wherein the first transistor and the second transistor each have lower off-state current than the third transistor, the fourth transistor, the fifth transistor, and the sixth transistor,
   wherein a gate of the third transistor is electrically connected to a gate of the fourth transistor,
   wherein one of a source and a drain of the third transistor is electrically connected to a first power supply line,
   wherein the other of the source and the drain of the third transistor is electrically connected to one of a source and a drain of the first transistor and one of a source and a drain of the second transistor,
   wherein the other of the source and the drain of the first transistor is electrically connected to one of a source and a drain of the fourth transistor,
   wherein the other of the source and the drain of the fourth transistor is electrically connected to a second power supply line,
   wherein a gate of the first transistor is electrically connected to a gate of the second transistor,
   wherein the other of the source and the drain of the second transistor is electrically connected to a gate of the fifth transistor and a gate of the sixth transistor,
   wherein one of a source and a drain of the fifth transistor is electrically connected to the first power supply line,
   wherein the other of the source and the drain of the fifth transistor is electrically connected to one of a source and a drain of the sixth transistor, and
   wherein the other of the source and the drain of the sixth transistor is electrically connected to the second power supply line.
7. The semiconductor device according to claim 6 further comprising a capacitor,
   wherein the capacitor is electrically connected to the other of the source and the drain of the second transistor, the gate of the fifth transistor, and the gate of the sixth transistor.
8. The semiconductor device according to claim 6,
   wherein the third transistor and the fifth transistor are p-channel transistors, and
   wherein the fourth transistor and the sixth transistor are n-channel transistors.
9. The semiconductor device according to claim 6,
   wherein the third transistor and the fifth transistor are n-channel transistors, and
   wherein the fourth transistor and the sixth transistor are p-channel transistors.
10. The semiconductor device according claim 6, wherein the first transistor and the second transistor each include an oxide semiconductor layer including a channel formation region.

11. A method for driving a semiconductor device comprising a first transistor, a second transistor, a third transistor, a fourth transistor, a fifth transistor, and a sixth transistor,
- wherein the third transistor and the fourth transistor have different conductivity types,
- wherein the fifth transistor and the sixth transistor have different conductivity types,
- wherein the first transistor and the second transistor each have lower off-state current than the third transistor, the fourth transistor, the fifth transistor, and the sixth transistor,
- wherein a gate of the third transistor is electrically connected to a gate of the fourth transistor,
- wherein one of a source and a drain of the third transistor is electrically connected to a first power supply line,
- wherein the other of the source and the drain of the third transistor is electrically connected to one of a source and a drain of the fourth transistor and one of a source and a drain of the second transistor,
- wherein the other of the source and the drain of the fourth transistor is electrically connected to one of a source and a drain of the first transistor,
- wherein the other of the source and the drain of the first transistor is electrically connected to a second power supply line,
- wherein a gate of the first transistor is electrically connected to a gate of the second transistor,
- wherein the other of the source and the drain of the second transistor is electrically connected to a gate of the fifth transistor and a gate of the sixth transistor,
- wherein one of a source and a drain of the fifth transistor is electrically connected to the first power supply line,
- wherein the other of the source and the drain of the fifth transistor is electrically connected to one of a source and a drain of the sixth transistor, and
- wherein the other of the source and the drain of the sixth transistor is electrically connected to the second power supply line, the method comprising the steps of:
- turning off the first transistor and the second transistor;
- changing a potential of the gate of the third transistor and a potential of the gate of the fourth transistor after turning off the first transistor and the second transistor; and
- turning on the first transistor and the second transistor after changing the potential of the gate of the third transistor and the potential of the gate of the fourth transistor,
- wherein the first transistor and the second transistor are in an off state while the potential of the gate of the third transistor and the potential of the fourth transistor change.

12. The method for driving a semiconductor device according to claim 11 further comprising a capacitor,
- wherein the capacitor is electrically connected to the other of the source and the drain of the second transistor, the gate of the fifth transistor, and the gate of the sixth transistor.

13. The method for driving a semiconductor device according to claim 11,
- wherein the third transistor and the fifth transistor are p-channel transistors, and
- wherein the fourth transistor and the sixth transistor are n-channel transistors.

14. The method for driving a semiconductor device according to claim 11,
- wherein the third transistor and the fifth transistor are n-channel transistors, and
- wherein the fourth transistor and the sixth transistor are p-channel transistors.

15. The method for driving a semiconductor device according claim 11, wherein the first transistor and the second transistor each include an oxide semiconductor layer including a channel formation region.

16. A method for driving a semiconductor device comprising a first transistor, a second transistor, a third transistor, a fourth transistor, a fifth transistor, and a sixth transistor,
- wherein the third transistor and the fourth transistor have different conductivity types,
- wherein the fifth transistor and the sixth transistor have different conductivity types,
- wherein the first transistor and the second transistor each have lower off-state current than the third transistor, the fourth transistor, the fifth transistor, and the sixth transistor,
- wherein a gate of the third transistor is electrically connected to a gate of the fourth transistor,
- wherein one of a source and a drain of the third transistor is electrically connected to a first power supply line,
- wherein the other of the source and the drain of the third transistor is electrically connected to one of a source and a drain of the first transistor and one of a source and a drain of the second transistor,
- wherein the other of the source and the drain of the first transistor is electrically connected to one of a source and a drain of the fourth transistor,
- wherein the other of the source and the drain of the fourth transistor is electrically connected to a second power supply line,
- wherein a gate of the first transistor is electrically connected to a gate of the second transistor,
- wherein the other of the source and the drain of the second transistor is electrically connected to a gate of the fifth transistor and a gate of the sixth transistor,
- wherein one of a source and a drain of the fifth transistor is electrically connected to the first power supply line,
- wherein the other of the source and the drain of the fifth transistor is electrically connected to one of a source and a drain of the sixth transistor, and
- wherein the other of the source and the drain of the sixth transistor is electrically connected to the second power supply line, the method comprising the steps of:
- turning off the first transistor and the second transistor;
- changing a potential of the gate of the third transistor and a potential of the gate of the fourth transistor after turning off the first transistor and the second transistor; and
- turning on the first transistor and the second transistor after changing the potential of the gate of the third transistor and the potential of the gate of the fourth transistor,
- wherein the first transistor and the second transistor are in an off state while the potential of the gate of the third transistor and the potential of the fourth transistor change.

17. The method for driving a semiconductor device according to claim 16 further comprising a capacitor,
- wherein the capacitor is electrically connected to the other of the source and the drain of the second transistor, the gate of the fifth transistor, and the gate of the sixth transistor.

18. The method for driving a semiconductor device according to claim 16,
- wherein the third transistor and the fifth transistor are p-channel transistors, and
- wherein the fourth transistor and the sixth transistor are n-channel transistors.

19. The method for driving a semiconductor device according to claim 16,
wherein the third transistor and the fifth transistor are n-channel transistors, and
wherein the fourth transistor and the sixth transistor are p-channel transistors.

20. The method for driving a semiconductor device according claim 16,
wherein the first transistor and the second transistor each include an oxide semiconductor layer including a channel formation region.

* * * * *